US012658907B2

(12) United States Patent
Hama et al.

(10) Patent No.: US 12,658,907 B2
(45) Date of Patent: Jun. 16, 2026

(54) SWITCH DRIVING DEVICE

(71) Applicant: ROHM CO., LTD., Kyoto (JP)

(72) Inventors: Kenji Hama, Kyoto (JP); Takahiro Kotani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 161 days.

(21) Appl. No.: 18/424,266

(22) Filed: Jan. 26, 2024

(65) Prior Publication Data

US 2024/0283439 A1 Aug. 22, 2024

Related U.S. Application Data

(63) Continuation of application No. 16/978,113, filed as application No. PCT/JP2019/000814 on Jan. 15, 2019, now Pat. No. 11,923,833.

(30) Foreign Application Priority Data

Apr. 2, 2018 (JP) ................................ 2018-071136

(51) Int. Cl.
*H03K 17/081* (2006.01)
*H02M 1/08* (2006.01)
*H03K 17/06* (2006.01)

(52) U.S. Cl.
CPC ........ *H03K 17/08104* (2013.01); *H02M 1/08* (2013.01); *H03K 17/063* (2013.01)

(58) Field of Classification Search
CPC ........... H03K 17/08104; H03K 17/063; H03K 2217/0063; H03K 2217/0072; H03K 2217/0081; H02M 1/08; H02M 1/0006; H02M 7/5387; H01L 2224/48137; H01L 2224/48247; H01L 2224/4903; Y02B 70/10

(Continued)

(56) References Cited

U.S. PATENT DOCUMENTS

| | | | |
|---|---|---|---|
| 4,998,163 A | 3/1991 | Salvati | |
| 5,880,573 A * | 3/1999 | Marshall | ................. H02P 23/22 |
| | | | 318/632 |

(Continued)

FOREIGN PATENT DOCUMENTS

| | | |
|---|---|---|
| JP | 2005-175454 | 6/2005 |
| JP | 2013-179821 | 9/2013 |

(Continued)

OTHER PUBLICATIONS

International Search Report issued in International Application No. PCT/JP2019/000814, Apr. 16, 2019, 5 pages with translation.

(Continued)

*Primary Examiner* — David Luo
(74) *Attorney, Agent, or Firm* — HSML P.C.

(57) ABSTRACT

For example, the switching drive device 100 includes a driver 30 configured to drive an N-type semiconductor switch element, a current limiter 50 configured to limit a current fed to a boot capacitor BC1 included in a bootstrap circuit BTC, and a current controller 60 configured to control the operation of the current limiter 50. The current controller 60 is configured to drive the current limiter 50 to limit the current fed to the boot capacitor BC1 when the charge voltage across the boot capacitor BC1 is higher than a threshold value.

8 Claims, 14 Drawing Sheets

(58) Field of Classification Search
USPC .......................................................... 318/700
See application file for complete search history.

(56) References Cited

U.S. PATENT DOCUMENTS

| | | | |
|---|---|---|---|
| 8,593,211 B2 * | 11/2013 | Forghani-Zadeh | .......................... H03K 17/08122 327/108 |
| 9,525,413 B2 * | 12/2016 | Roberts | ............ H03K 17/04123 |
| 9,571,093 B2 | 2/2017 | Kinzer et al. | |
| 2005/0134533 A1 | 6/2005 | Sasada et al. | |
| 2008/0068368 A1 | 3/2008 | Sasada et al. | |
| 2013/0241621 A1 | 9/2013 | Forghani-Zadeh et al. | |
| 2015/0088991 A1 | 3/2015 | Sato | |
| 2016/0105175 A1 | 4/2016 | Ishimatsu et al. | |
| 2017/0155323 A1 | 6/2017 | Umemoto | |
| 2017/0310323 A1 | 10/2017 | Ishimatsu et al. | |
| 2019/0165783 A1 | 5/2019 | Ishimatsu et al. | |

FOREIGN PATENT DOCUMENTS

| | | |
|---|---|---|
| JP | 2014-023269 | 2/2014 |
| JP | 2015-064745 | 4/2015 |
| JP | 2015-511112 | 4/2015 |
| JP | 2016-082281 | 5/2016 |
| JP | 2016-158457 | 9/2016 |
| JP | 2017-099194 | 6/2017 |
| JP | 2018-007403 | 1/2018 |

OTHER PUBLICATIONS

Office Action issued in German Patent Application No. 11 2019 000 870.6 issued on Oct. 29, 2020, 8 pages.

Office Action issued in corresponding Japanese Patent Application No. 2020-511604, Jan. 4, 2022, 8 pages w/ translation.

Office Action issued in corresponding Japanese Patent Application No. 2020-511604, Jul. 12, 2022, 3 pages.

* cited by examiner

VBS

VGr
VthH
VthL

CLMT time

SWITCH DRIVING DEVICE

TECHNICAL FIELD

The present invention relates to switch driving devices.

BACKGROUND ART

Some switch driving devices used as switching regulators or motor drivers employ a half-bridge output stage in which two switch elements are connected in series and the connection point between them is connected to a load (see, for example, Patent Document 1 identified below). A half-bridge output stage is often combined with a bootstrap circuit to secure a drive voltage needed when an N-type semiconductor switch element on the side connected to a drive power source (that is, a high-side switch element) is on (see, for example, Patent Document 2 identified below). In such switch driving devices, the charge voltage across a boot capacitor included in the bootstrap circuit is used to secure the gate-source voltage (gate voltage) of the high-side switch element connected to the drive power source.

LIST OF CITATIONS

Patent Literature

Patent Document 1: Japanese Patent Application published as No. 2015-64745.
Patent Document 2: Japanese Patent Application published as No. 2016-82281.

SUMMARY OF THE INVENTION

Technical Problem

Inconveniently, depending on the configuration of the switch driving device, the charge voltage across the boot capacitor can become higher than the gate voltage permitted in (the permissible gate voltage of) the high-side element; that is, what is called overcharging can occur. Overcharging of the boot capacitor can cause the signal fed to the gate of the switching element to become higher than the permissible gate voltage, possibly leading to a fault.

An object of the present invention is to provide a switch driving device that has a simple circuit configuration and that can drive a high-side element reliably and stably.

Means for Solving the Problem

To achieve the above object, according to one aspect of the present invention, a switch driving device includes: a gate driver configured to drive an N-type semiconductor switch element; a current limiter configured to limit the current fed to a boot capacitor included in a bootstrap circuit configured to apply a voltage to the gate driver; and a current controller configured to control the operation of the current limiter. The current controller drives the current limiter to limit the current fed to the boot capacitor when the charge voltage across the boot capacitor is higher than a threshold value.

With this configuration, in accordance with the charge status of the boot capacitor, the current controller can drive the current limiter to limit the current fed to the boot capacitor. This helps prevent the gate of the N-type semiconductor switch element from being fed with a drive signal with a voltage level higher than the permissible gate voltage.

It is thus possible to prevent deterioration and the like of the N-type semiconductor switch element.

In the configuration described above, preferably, the current limiter includes a switch element configured to turn on or off in accordance with a signal from the current controller. With this configuration, it is possible to passively limit the current fed to the boot capacitor.

In the configuration described above, preferably, the current controller is configured to judge whether the boot capacitor is being charged or not and to sense the charge voltage across the boot capacitor, and the current controller is configured to drive the current limiter when, while the boot capacitor is being charged, the charge voltage across the boot capacitor becomes higher than the threshold value. With this configuration, it is possible to accurately sense when the boot capacitor is in an overcharged state. It is thus possible to make the N-type semiconductor switch element operate stably.

In the configuration described above, preferably, the current controller is configured to sense the charge voltage across the boot capacitor based on the terminal-to-terminal voltage across the boot capacitor or a division voltage thereof. With this configuration, it is possible to more accurately sense the charge status of the boot capacitor.

In the configuration described above, preferably, the N-type semiconductor switch element is a high-side switch element arranged between a power source and a load to form a half-bridge output stage, and the current controller is configured to judge the boot capacitor to be being charged when the high-side switch element is off. With this configuration, it is possible to easily sense a state where the boot capacitor goes into an overcharged state.

In the configuration described above, preferably, the current controller is configured to judge whether the high-side switch element is on or off by acquiring a drive signal fed in from outside to drive the high-side switch element. With this configuration, it is possible to sense an overcharged state of the boot capacitor with a simple circuit configuration.

In the configuration described above, preferably, the N-type semiconductor switch element is a high-side switch element arranged between a power source and a load to form a half-bridge output stage, and the current controller is configured to sense the voltage at the connection point between the high-side switch element and the load to judge the boot capacitor to be being charged when the voltage is equal to or less than a threshold value. With this configuration, it is possible to sense an overcharged state of the boot capacitor more accurately.

In the configuration described above, preferably, the current limiter is an element of which the resistance value is variable, and is connected to the anode side of a boot diode included in the bootstrap circuit, and the current limiter is configured to sense the voltage of a control power source to which the bootstrap circuit is connected. Preferably, the current limiter is configured to increase the resistance value of the current limiter when the control voltage is high and to decrease the resistance value of the current limiter when the control voltage is low.

In the configuration described above, preferably, the N-type semiconductor switch element employs a semiconductor made from silicon carbide (SiC).

Advantageous Effects of the Invention

According to the present invention, it is possible to provide a switch driving device that has a simple circuit configuration and that can drive an N-type semiconductor switch element reliably and stably.

DESCRIPTION OF EMBODIMENTS

Hereinafter, embodiments of the present invention will be described with reference to the drawings.

First Embodiment

Figure 1:
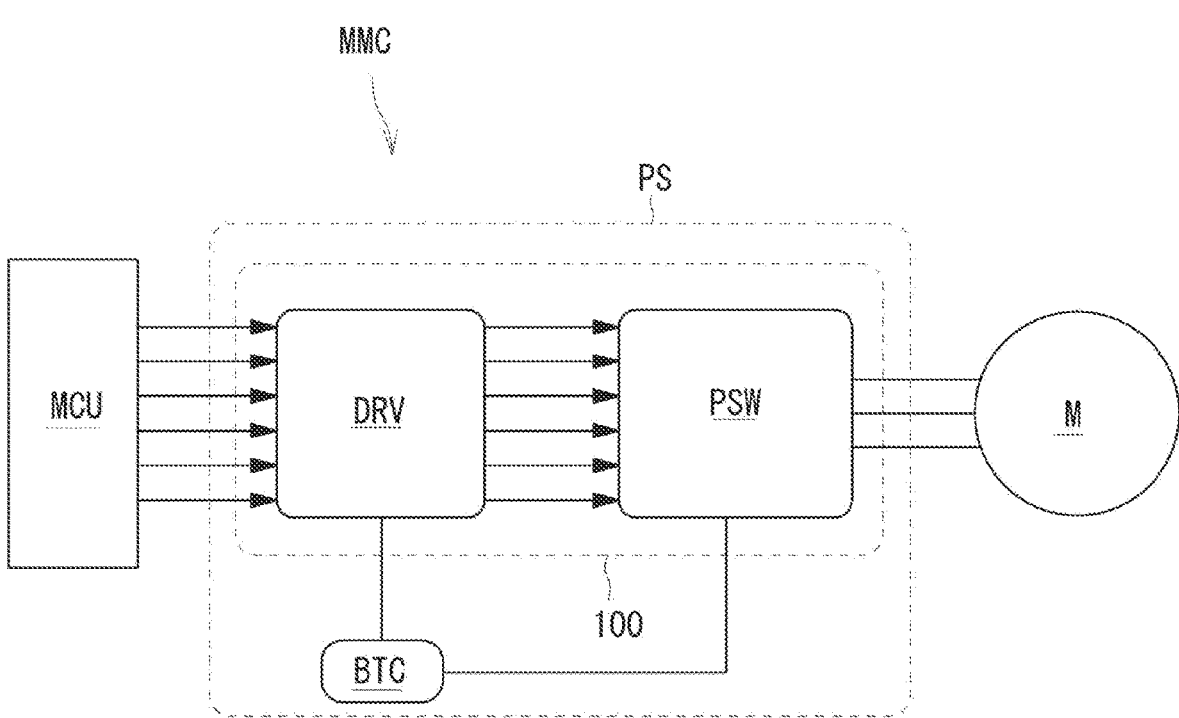
FIG. 1 is a schematic diagram showing a motor driving device.

FIG. 1 is a schematic diagram showing a motor driving device. As shown in FIG. 1, the motor M is a three-phase alternating-current motor. The motor M has a U-phase coil MU, a V-phase coil MV, and a W-phase coil MW (see FIG. 2, which will be referred to later). In the motor M, the coils MU, MV, and MW are star-connected. This however is not meant as any limitation; they may instead be delta-connected. The motor M is driven by the motor driving device MMC, which includes a motor control unit MCU and a power supply PS.

The motor control unit MCU includes logic circuits (unillustrated). Based on information from the motor M on the position of its rotor, the motor control unit MCU generates phase-by-phase energization control signals with which to control the energization of the coils of different phases (U-, V-, and W-phases) of the motor M with appropriate timing. The motor control unit MCU also changes the timing of excited phase switching, for example, when the rotation direction of the motor M is switched and when the rotation speed of the motor M is changed.

The power supply PS supplies driving electric power (electric current) to the coils of different phases of the motor M with timing based on the phase-by-phase energization control signals fed from the motor control unit MCU.

Figure 2:
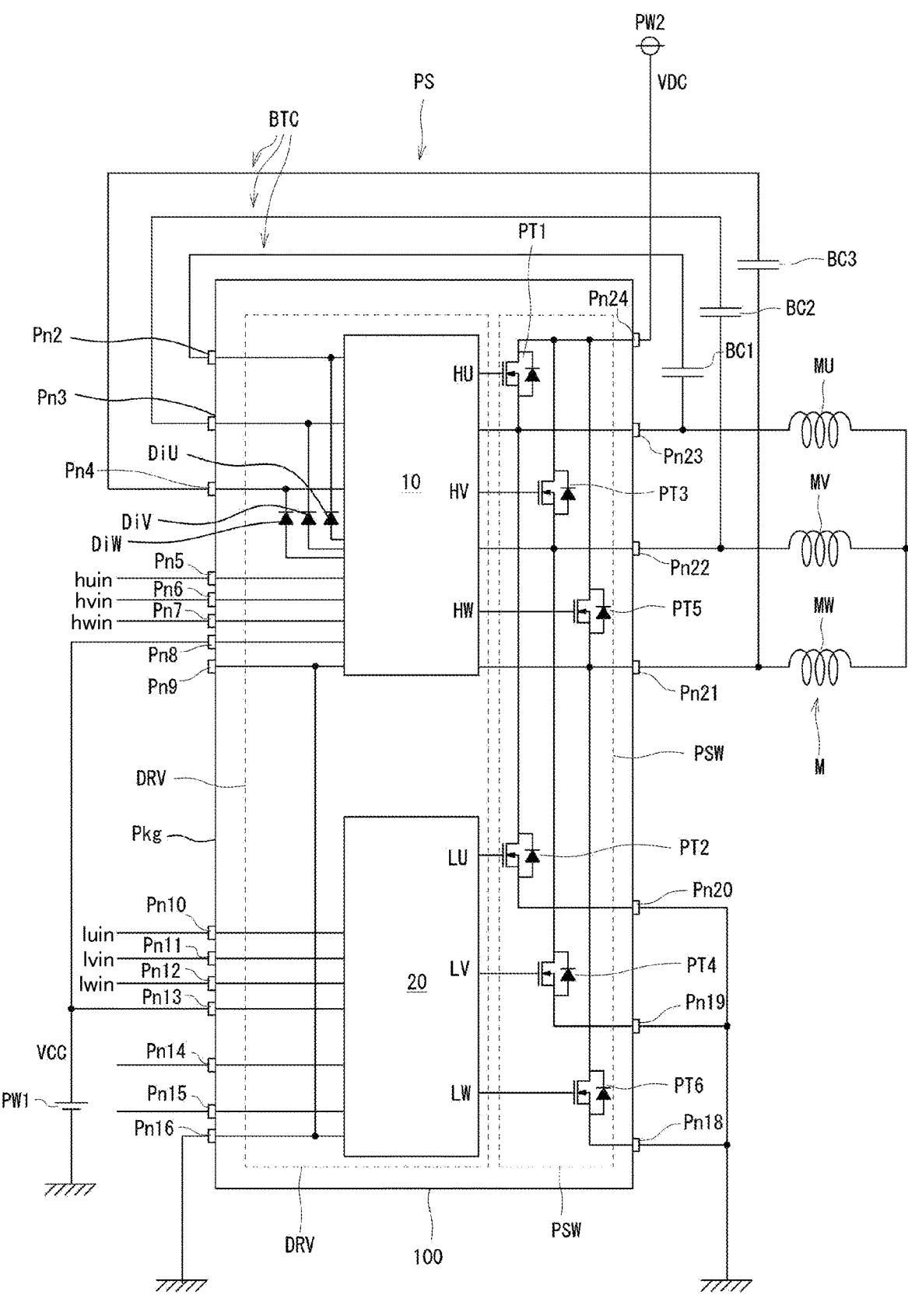
FIG. 2 is a block diagram of a power supply provided with a switch driving device according to the present invention.

Next, the power supply PS will be described with reference to the relevant drawing. FIG. 2 is a block diagram of a power supply provided with a switch driving device according to the present invention. As shown in FIGS. 1 and 2, the power supply PS includes a switch driving device 100 and a bootstrap circuit BTC. The switch driving device 100 includes a driver circuit DRV and a power switch circuit PSW.

As shown in FIG. 2, in the switch driving device 100, the driver circuit DRV and the power switch circuit PSW are, along with diodes DiU, DiV, and DiW constituting the bootstrap circuit BTC, incorporated in a single package Pkg. The boot diodes DiU, DiV, and DiW are here incorporated in the package Pkg. This however is not meant as any limitation; they may instead be provided outside the package Pkg.

As shown in FIG. 2, the power supply PS is connected to a first power source PW1 and a second power source PW2. The first power source PW1 supplies a control voltage VCC (for example, 10 V to 25 V) for the driver circuit DRV. The second power source PW2 supplies a drive voltage VDC (for example, about 300 V (for a 600 V model) for driving the motor M.

The power switch circuit PSW includes six transistors PT1 to PT6. Used as the six transistors PT1 to PT6 are, for example, power MOSFETs. These power MOSFETs are built in a semiconductor substrate of, for example, silicon carbide (SiC). That is, the transistors PT1 to PT6 are SiC-MOSFETs. The transistors PT1 to PT6 are all N-type MOSFETs.

In the power switch circuit PSW, the source of the transistor PT1 and the drain of the transistor PT2 are connected together. The drain of the transistor PT1 is connected to the second power source PW2. The source of the transistor PT2 is connected to a grounded point. In practice, the transistor PT2 may be connected to the grounded point via a resistor for current sensing. To the connection point between the source of the transistor PT1 and the drain of the transistor PT2, the U-phase coil MU of the motor M is connected.

The transistors PT3 and the PT4 are connected together in a similar manner to the transistors PT1 and PT2. To the connection point between the source of the transistor PT3 and the drain of the transistor PT4, the V-phase coil MV of the motor M is connected. The transistors PT5 and the PT6 are connected together in a similar manner to the transistors PT1 and PT2. To the connection point between the source of the transistor PT5 and the drain of the transistor PT6, the W-phase coil MW of the motor M is connected.

In the present description, the transistors PT1, PT3, and PT5 in the second power source PW2 side of the power switch circuit PSW are referred to as high-side transistors, and the transistors PT2, PT4, and PT6 in the grounded point side are referred to as low-side transistors.

The driver circuit DRV includes a high-side driver circuit 10 and a low-side driver circuit 20. The high-side driver circuit 10 connects to the gates of the high-side transistors PT1, PT3, and PT5, and feeds these gates with drive signals HU, HV, and HW respectively. The high-side transistors PT1, PT3, and PT5 are on when the corresponding drive signals HU, HV, and HW have a voltage level of H level. The low-side driver circuit 20 connects to the gates of the low-side transistors PT2, PT4, and PT6, and feeds these gates with drive signals LU, LV, and LW respectively. The low-side transistors PT2, PT4, and PT6 are on when the corresponding drive signals LU, LV, and LW have a voltage level of H level. Here, a voltage level of H level denotes a state of a voltage being higher than a prescribed voltage, and a voltage level of L level denotes a state of a voltage being lower than a prescribed voltage.

For example, with the transistors PT1 and PT4 on and with all the other transistors off, the drive voltage VDC from the second power source PW2 is applied to the U-phase and V-phase coils MU and MV. That is, a current passes from the U-phase coil MU to the V-phase coil MV. In this way, in accordance with the drive signals from the driver circuit DRV, the timing with which the transistors PT1 to PT6 are turned on and off is switched such that a current is fed to the coils MU, MV, and MW of different phases to excite the coils and thereby drive the motor M to rotate.

As shown in FIG. 2, the high-side and low-side driver circuits 10 and 20 operate by being fed with the control voltage VCC from the first power source PW1. The high-side and low-side driver circuits 10 and 20 are connected to the motor control unit MCU, and receive from it energization control signals huin, hvin, hwin, luin, lvin, and lwin for controlling the energization of the transistors PT1 to PT6. The energization control signals huin, hvin, and hwin are fed to the high-side driver circuit 10, and the energization control signals luin, lvin, and lwin are fed to the low-side driver circuit 20.

The driver circuit DRV feeds the drive signal HU to the gate of the transistor PT1, and feeds the drive signal LU to the gate of the transistor PT2. Likewise, the driver circuit DRV feeds the drive signal HV to the gate of the transistor PT3, and feeds the drive signal LV to the gate of the transistor PT4. Further, the driver circuit DRV feeds the drive signal HW to the gate of the transistor PT5, and feeds the drive signal LW to the gate of the transistor PT6.

The bootstrap circuit BTC is a circuit that feeds the high-side driver circuit 10 with voltages necessary to drive the high-side transistors PT1, PT3, and PT5. The bootstrap circuit BTC is provided one for each of the high-side transistors PT1, PT3, and PT5. It is, for example, a circuit that connects between the first power source PW1 and the source of the transistor PT1, and has a boot diode DiU and a boot capacitor BC1 connected in series from the first power source PW1 side. The voltage at the connection point between the boot diode DiU and the boot capacitor BC1 is acquired by the high-side driver circuit 10 as the voltage necessary to drive the high-side transistor PT1. The bootstrap circuit BTC may further have, arranged between the first power source PW1 and the boot diode DiU, a resistor for generating a current with a predetermined current value, which diode is here omitted.

The bootstrap circuit BTC is provided also with a boot diode DiV and a boot capacitor BC2 corresponding to the high-side transistor PT3 so that a voltage necessary to drive it is acquired by the high-side driver circuit 10. The bootstrap circuit BTC is provided further with a boot diode DiW and a boot capacitor BC3 corresponding to the high-side transistor PT5 so that a voltage necessary to drive it is acquired by the high-side driver circuit 10.

Next, the driver circuit will be described in more detail. The driver circuit DRV in the switch driving device 100 includes a circuit for driving the transistors PT1 and PT2, a circuit for driving the transistors PT3 and PT4, and a circuit for driving the transistors PT5 and PT6. These circuits for driving transistors all have the same configuration. Accordingly, the following description deals with, as the driver circuit DRV, the portion of it that serves as the circuit for driving the transistors PT1 and PT2. Likewise, the following description deals with, as the bootstrap circuit BTC, the circuit including the boot diode DiU and the boot capacitor BC1 corresponding to the transistor PT1. The transistor PT1 will be referred to as the high-side transistor PT1, and the transistor PT2 as the low-side transistor PT2. The connection point between the source of the high-side transistor PT1 and the drain of the low-side transistor PT2 will be referred to as the first point P1, and the connection point between the cathode of the boot diode DiU and the boot capacitor BC1 in the bootstrap circuit BTC as the second point P2.

Figure 3:
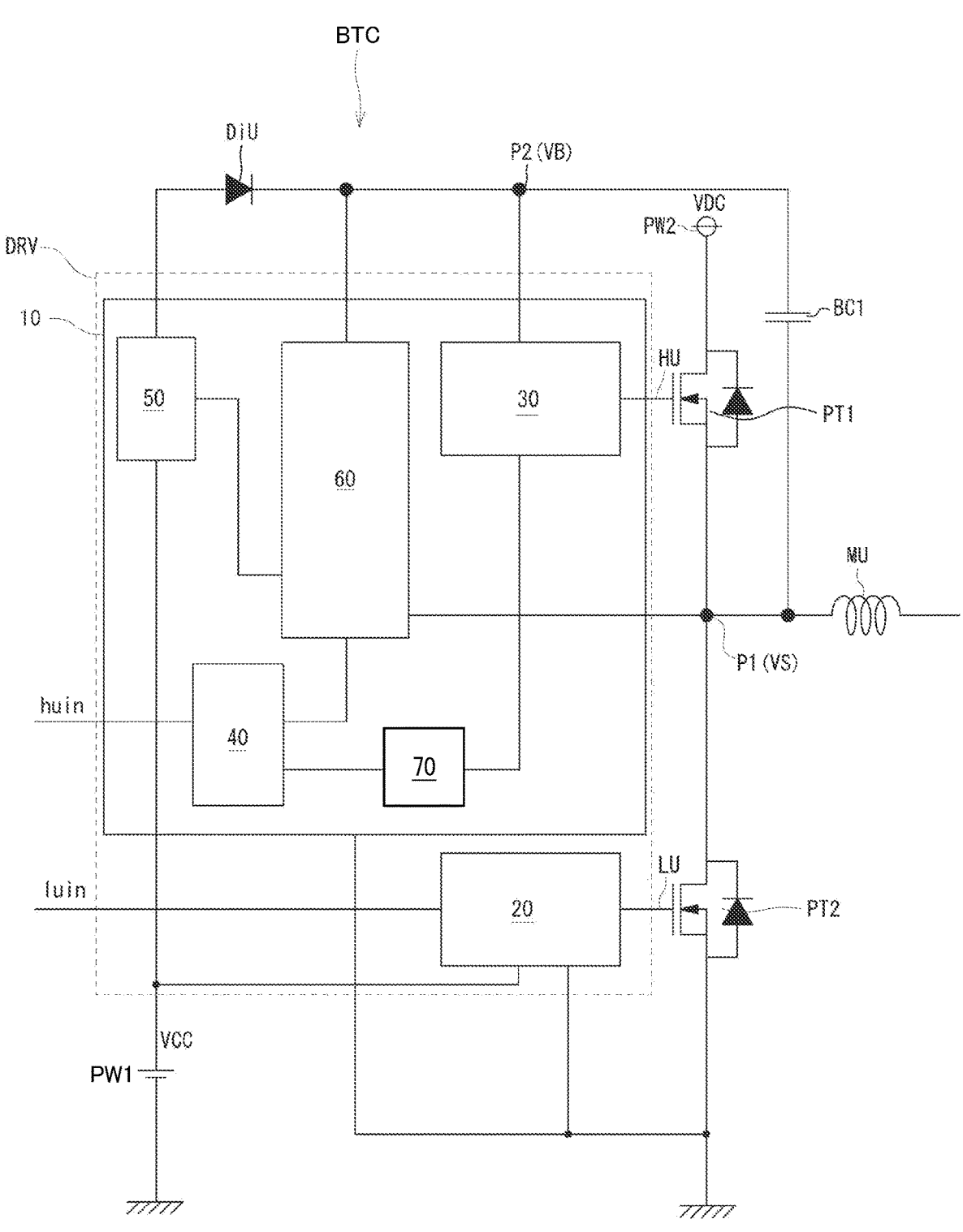
FIG. 3 is a block diagram showing an outline of a configuration of a driver circuit.

FIG. 3 is a block diagram showing an outline of the configuration of the driver circuit. The driver circuit DRV shown in FIG. 3 includes, as mentioned previously, a high-side driver circuit 10 and a low-side driver circuit 20. In the switch driving device 100 according to the present invention, the low-side driver circuit 20 has the same configuration as those used in conventional switch driving devices. Accordingly, no detailed description will be given of the configuration and operation of the low-side driver circuit 20.

As shown in FIG. 3, the high-side driver circuit 10 includes a high-side gate driver 30, an input signal control circuit 40, a current limiter 50, a current controller 60, and a high-withstand-voltage level shift circuit 70.

The input signal control circuit 40 feeds an energization control signal (here, huin) from the motor control unit MCU via the high-withstand-voltage level shift circuit 70 to the high-side gate driver 30.

Based on the signal fed from the input signal control circuit 40, the high-side gate driver 30 generates a drive signal HU for driving the high-side transistor PT1, and feeds it to the gate of the high-side transistor PT1.

The high-side gate driver 30 acquires a voltage necessary to drive the high-side transistor PT1 from the bootstrap circuit BTC composed of the boot diode DiU and the boot capacitor BC1. The bootstrap circuit BTC charges the boot capacitor BC1 with a current fed from the first power source PW1 so that the voltage across the boot capacitor BC1 is, for example, equal to or higher than a gate threshold voltage. This keeps the voltage VB at the second point P2 higher, by the charge voltage across the boot capacitor BC1, than the voltage VS at the first point P1 regardless of what voltage is present at the first point P1. The high-side gate driver 30 can thus, by acquiring the voltage VB at the second point P2, acquire the voltage necessary to drive the high-side transistor PT1.

The current limiter 50 is provided in the circuit that connects between the first power source PW1 and the boot capacitor BC1; more specifically, it is provided between the first power source PW1 and the anode of the boot diode DiU. In accordance with a signal (current limiting signal) from the current controller 60, the current limiter 50 limits the current fed from the first power source PW1 to the boot capacitor BC1. That is, with the current limiter 50, the terminal-to-terminal voltage (charge voltage) across the boot capacitor BC1 is adjusted (limited). The configuration of the current limiter 50 will be described in detail later.

Figure 4:
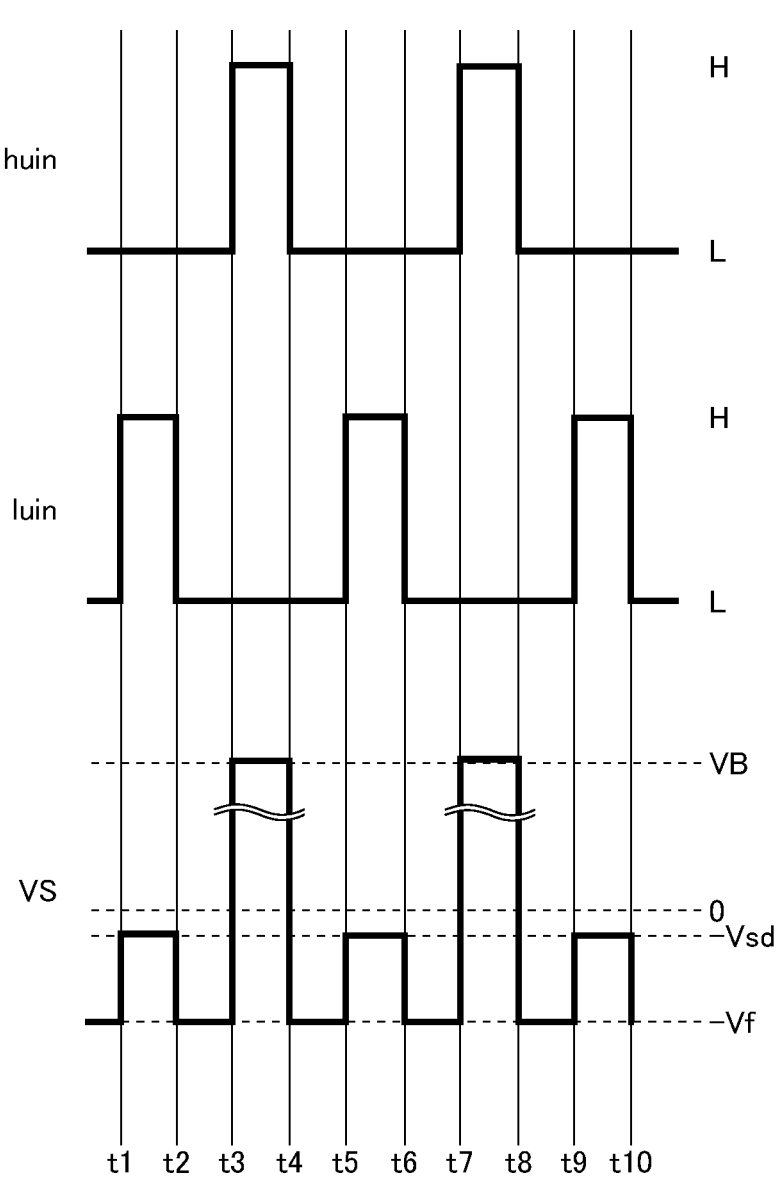
FIG. 4 is a timing chart showing output operation of a switch driving device.

Next, the operation of the switch driving device 100 according to the present invention will be described with reference to FIG. 4. FIG. 4 is a timing chart showing U-phase output operation (behavior in mode 2, which will be discussed later) of the switch driving device 100, depicting, from top down, the energization control signals huin and luin and the voltage VS. In the diagram, Vsd represents the source-drain voltage of the low-side transistor PT2, and Vf represents the forward voltage drop across a parasitic diode that accompanies the low-side transistor PT2. V-phase and W-phase output operation is similar to U-phase output operation; for its description, the energization control signals huin and luin have simply to be read as the energization control signals hvin and lvin, or as the energization control signals hwin and lwin respectively. In FIG. 4, to simply description, delay times are ignored.

In the switch driving device 100, the high-side and low-side transistors PT1 and PT2 are controlled to operate complementarily. That is, they are controlled such that, as observed between time points t3 and t4 and between time points t7 and t8, when the high-side transistor PT1 is on (huin=H), the low-side transistor PT2 is off (luin=L), and that, as observed between time points t1 to t2, between time points t5 and t6, and between time points t9 and t10, when the low-side transistor PT2 is on (luin=H), the high-side transistor PT1 is off (huin=L). If a through current passes between the high-side and low-side transistors PT1 and PT2, it may degrade or destroy those transistors. To avoid that, for example, as observed between time points t2 and t3, between time points t4 and t5, between time points t6 and t7, and between time points t8 and t9, switching from the state where the high-side transistor PT1 is on to the state where the low-side transistor PT2 is on is accompanied by a dead time in which the high-side and low-side transistors PT1 and PT2 are both off (huin=luin=L).

In the switch driving device 100 operating as described above, turning the high-side transistor PT1 on and the low-side transistor PT2 off results in a voltage from the second power source PW2 being applied to the U-phase coil MU as a load; that is, a current is supplied. At this point, the voltage VS at the first point P1 can be generally equal to the drive voltage VDC of the second power source PW2, that is, about 300 V.

Owing to the bootstrap circuit BTC, the voltage VB at the second point P2, to which the high-side gate driver 30 is connected, is higher than the voltage VS at the first point P1 by the terminal-to-terminal voltage (hereinafter the charge voltage VBS) across the boot capacitor BC1 resulting from its being charged. For example, in a case where the voltage VS at the first point P1 swings between 0 V and 300 V, assuming that the charge voltage across BC1 equals 18 V, the voltage VB at the second point P2 swings between about 18 V and 318 V.

The high-side gate driver 30 can, by being fed with the voltage VB from the second point P2, acquire at any time a voltage with which the high-side transistor PT1 can be driven. That is, the boot capacitor BC1 serves as a floating power source. The boot capacitor BC1 is configured to be chargeable up to a voltage higher than the gate threshold voltage.

The charging of the boot capacitor BC1 will now be described. The description first proceeds assuming that the current limiter 50 is absent. In the switch driving device 100, a condition where a motor current passes in the forward direction of the low-side transistor PT2 will be referred to as mode 1, and a condition where the body diode of the low-side transistor PT2 is on (during low-side regeneration) will be referred to as mode 2. The boot capacitor BC1 is charged in modes 1 and 2.

In mode 1, the U-phase coil MU has a motor current IM passing in it from the neutral point of the motor M via the first point P1 and the low-side transistor PT2 to a grounded terminal. Here, the voltage VS at the first point P1 is equal to or approximately equal to the grounded point potential (0 V). In reality, the voltage here is higher than 0 V by IM×R because of a resistance component R owing to the on-resistance of the low-side transistor PT2 and the current sense resistor. Thus, the terminal-to-terminal voltage across the boot capacitor BC1 is approximately equal to the control voltage VCC from the first power source PW1, and in this state, the boot capacitor BC1 is charged up to the control voltage VCC. More precisely, let the charge voltage across the boot capacitor BC1 be VBS, the forward voltage drop across the boot diode DiU be VFB, the on-resistance value of the low-side transistor PT2 be Ron, and the motor current be IM, then VBS=VCC−VFBOOT−Ron×IM. In mode 1, charging takes place when the voltage VB at the second point P2 becomes equal to or lower than the above-mentioned charge voltage VBS.

In mode 2, operation proceeds as follows. As shown in FIG. 3, the high-side and low-side transistors PT1 and PT2 include parasitic diodes (body diodes). Let the forward voltage drop across the parasitic diode of the low-side transistor PT2 be Vf. When the motor M is operated regeneratively in mode 2, the U-phase coil MU has a motor current passing in it from the first point P1 to the neutral point. At this point, the high-side transistor PT1 is off, and thus no current passes from the second power source PW2. Although the low-side transistor PT2 is off, a current passes via the parasitic diode. Thus, the voltage VS at the first point P1 becomes equal to −Vf, which is lower than the ground voltage. Accordingly, the terminal-to-terminal voltage across the boot capacitor BC1 equals approximately (VCC+ Vf). More precisely, the boot capacitor BC1 is charged up to VBS=VCC−VFBOOT+Vf. Thus, the charge voltage VBS across the boot capacitor BC1 is higher in mode 2 than in mode 1.

The terminal-to-terminal voltage (VCC+Vf) across the boot capacitor BC1 can become higher than the gate-source voltage (hereinafter the permissible gate voltage) permitted in the high-side transistor PT1. If the terminal-to-terminal voltage (VCC+Vf) across the boot capacitor BC1 becomes higher than the permissible gate voltage, it may degrade or destroy the high-side transistor PT1. A state where the boot capacitor BC1 has been charged to the point that the charge voltage VBS across it reaches a voltage higher than the permissible gate voltage of the high-side transistor PT1 will be called an overcharged state. A SiC-based transistor in particular, due to a high forward voltage drop Vf of the parasitic diode that accompanies it, is liable to cause an overcharged state as mentioned above.

To avoid that, in the high-side driver circuit 10, the circuit leading from the first power source PW1 to the boot diode DiU is provided with a current limiter 50. The current limiter 50 is so operated as to limit the current fed to the boot capacitor BC1, thereby to prevent the boot capacitor BC1 from going into an overcharged state.

Figure 5:
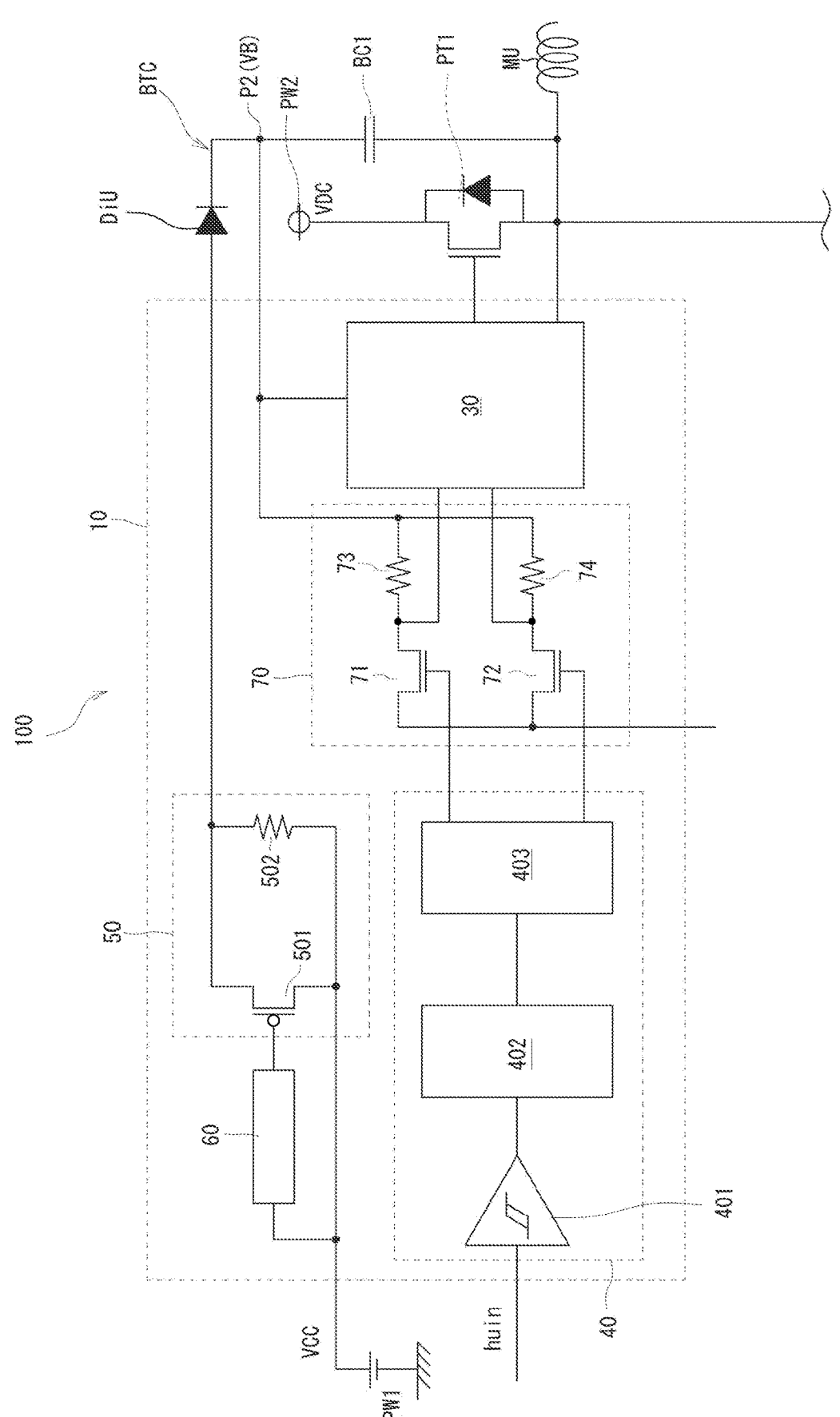
FIG. 5 is a circuit diagram of one example of a high-side driver circuit used in a switch driving device according to the present invention.

Next, as a principal portion of the switch driving device 100 according to the present invention, the high-side driver circuit 10 will be described. FIG. 5 is a circuit diagram of an example of the high-side driver circuit 10 used in the switch driving device 100 according to the present invention. As described above, an overcharged state of the boot capacitor BC1 results from the terminal-to-terminal voltage across the boot capacitor BC1 (VCC+Vf) becoming too high. And the boot capacitor BC1 is more likely to be overcharged when the control voltage VCC from the first power source PW1 connected is high than when it is low. Accordingly, in the switch driving device 100, the high-side driver circuit 10 is so configured that, regardless of whichever of different supply voltages is connected, the boot capacitor BC1 does not go into an overcharged state. Now, the high-side driver circuit 10 will be described in detail.

As shown in FIG. 5, the high-side driver circuit 10 includes a high-side gate driver 30, an input signal control circuit 40, a current limiter 50, a current controller 60, and a high-withstand-voltage level shift circuit 70. The current controller 60 sends a signal to the current limiter 50 to drive it to produce a voltage drop between the first power source PW1 and the boot diode DiU, thereby to lower the voltage that charges the boot capacitor BC1. In other words, the current limiter 50 limits the current that charges the boot capacitor BC1.

The input signal control circuit 40 is fed with the energization control signal huin from the motor control unit MCU (see FIG. 1 etc.). The input signal control circuit 40 includes an inverter (Schmitt buffer) 401 that converts the energization control signal huin into a L signal or a H signal. It also includes a level shift circuit 402 that raises the voltage level of the signal output from the inverter 401. This facilitates the handling of signals in the high-side driver circuit 10. The input signal control circuit 40 further includes a pulse generator 403 that outputs a set pulse signal and a reset pulse signal based T on the signal output from the level shift circuit 402.

The set pulse signal and the reset pulse signal output from the pulse generator 403 are fed to the high-withstand-voltage level shift circuit 70. The high-withstand-voltage level shift circuit 70 includes a transistor 71, a transistor 72, a resistor 73 and a resistor 74. The transistors 71 and 72 are N-type MOSFETs, and are high-withstand-voltage transistors. The drain of the transistor 71 is connected via the resistor 73 to the second point P2, or to a point at the same potential as the second point P2. The source of the transistor 71 is connected via an unillustrated resistor to the grounded point, and the gate of the transistor 71 is fed with a pulse signal from the pulse generator 403. The drain of the transistor 72 is connected via the resistor 74 to the second point P2, or to a point at the same potential as the second point P2. The source of the transistor 72 is connected via an unillustrated resistor to the grounded point, and the gate of the transistor 72 is fed with a pulse signal from the pulse generator 403. The circuit that includes the transistor 71 and the resistor 73 (that is, the circuit that outputs the set pulse signal) and the circuit that includes the transistor 72 and the resistor 74 (that is, the circuit that outputs the reset pulse signal) have their respective signal lines arranged symmetrically. The connection point between the drain of the transistor 71 and the resistor 73 and the connection point between the drain of the transistor 72 and the resistor 74 are connected individually to a clamp circuit 301 (see FIG. 8) that limits to equal to or lower than a predetermined value the level of the input signal to an inverter (unillustrated) constituting an input stage of the high-side gate driver 30.

As mentioned above, the signal lines of the set and reset pulse signals are arranged symmetrically. For example, the length from the connection point between the drain of the transistor 71 and the resistor 73 to the clamp circuits 301 (that is, for example, the length of the conductor for the set pulse signal) is equal to, or approximately equal to, the length from the connection point between the drain of the transistor 72 and the resistor 74 to the clamp circuits 301 (that is, for example, the length of the conductor for the reset pulse signal). Also, the pair comprising the transistor 71 and the resistor 73 and the pair comprising the transistor 72 and the resistor 74 have their respective elements arranged symmetrically. This arrangement results in equal conductor resistances and equal parasitic capacitances, and helps suppress a deviation between the signals ascribable to the layout of conductors.

The current limiter 50 includes a transistor 501 and a resistor 502. The resistor 502 is arranged in the circuit that connects between the first power source PW1 and the boot diode DiU. The resistor 502 determines the value of the current that is fed to the boot capacitor BC1. The transistor 501 is connected in parallel with the resistor 502. The transistor 501 is a P-type MOSFET, and has its source connected to the connection point between the first power source PW1 and the resistor 502. The drain of the transistor 501 is connected to the connection point between the resistor 502 and the boot diode DiU. The gate of the transistor 501 is fed with a signal from the current controller 60.

The current controller 60 senses the voltage of the first power source PW1. For example, assume that, as the voltage of the first power source PW1, either VCC1 or VCC2 (<VCC 1) is permitted. Then, when the first power source PW1 yields the voltage VCC1, the current controller 60 feeds a H-level signal to the gate of the transistor 501. That is, when the first power source PW1 yields the voltage VCC1, the transistor 501 is off. On the other hand, when the first power source PW1 yields the voltage VCC2, the current controller 60 feeds a L-level signal to the gate of the transistor 501. That is, when the first power source PW1 yields the voltage VCC2, the transistor 501 is on. As the current controller 60, a well-known UVLO circuit can be utilized, for example, with its threshold voltage modified; accordingly, in this respect, no detailed description will be given.

For example, let the resistance value of the resistor 502 be R1 and the resistance value of the transistor 501 be R2. Here, R1>>R2. When the first power source PW1 yields the voltage VCC1, based on the signal from the current controller 60, the transistor 501 is off. Thus, the resistance value of the current limiter 50 equals R1. On the other hand, when the first power source PW1 yields the voltage VCC2, based on the signal from the current controller 60, the transistor 501 is on. Thus, the resistance value of the current limiter 50 equals the combined resistance of the transistor 501, and the resistor 502, which are connected in parallel, that is, R1×R2/(R1+R2). Accordingly, when the first power source PW1 is higher, the current limiter 50 has a higher resistance value, and the current limiter 50 produces a higher voltage drop. This means that the current that charges the boot capacitor BC1 is lower. Reversely, when the voltage of the first power source PW1 is lower, the current limiter 50 has a lower resistance value, and the current limiter 50 produces a lower voltage drop. This means that the current that charges the boot capacitor BC1 is higher.

With the configuration described above, the switch driving device 100 can be operated, for users that use it with the control voltage VCC set at a high voltage and hence with a small margin against overcharging, with a higher resistance value and, for users that use it with the control voltage VCC set at a low voltage and hence with a large margin against overcharging, with a lower resistance value.

Figure 6:
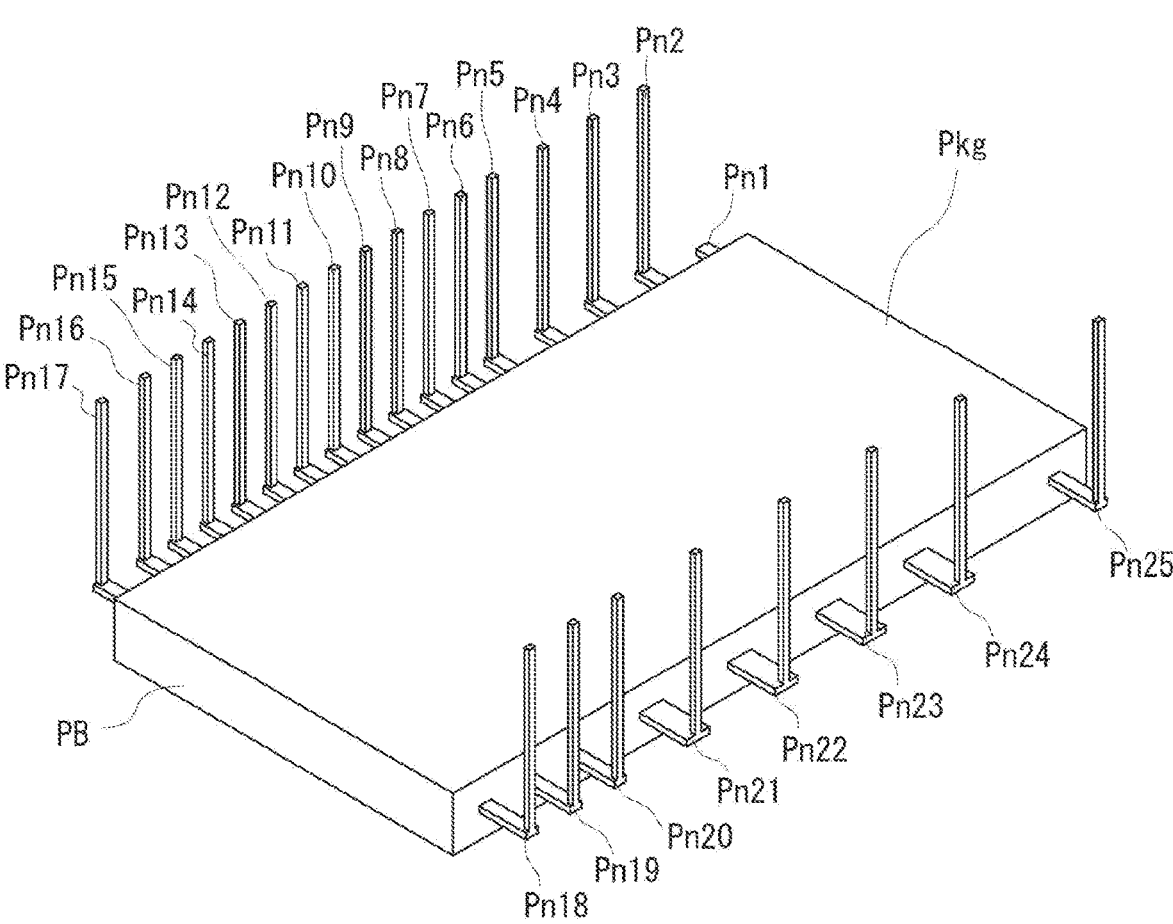
FIG. 6 is a perspective view of a package as seen from the underside.
Figure 7:
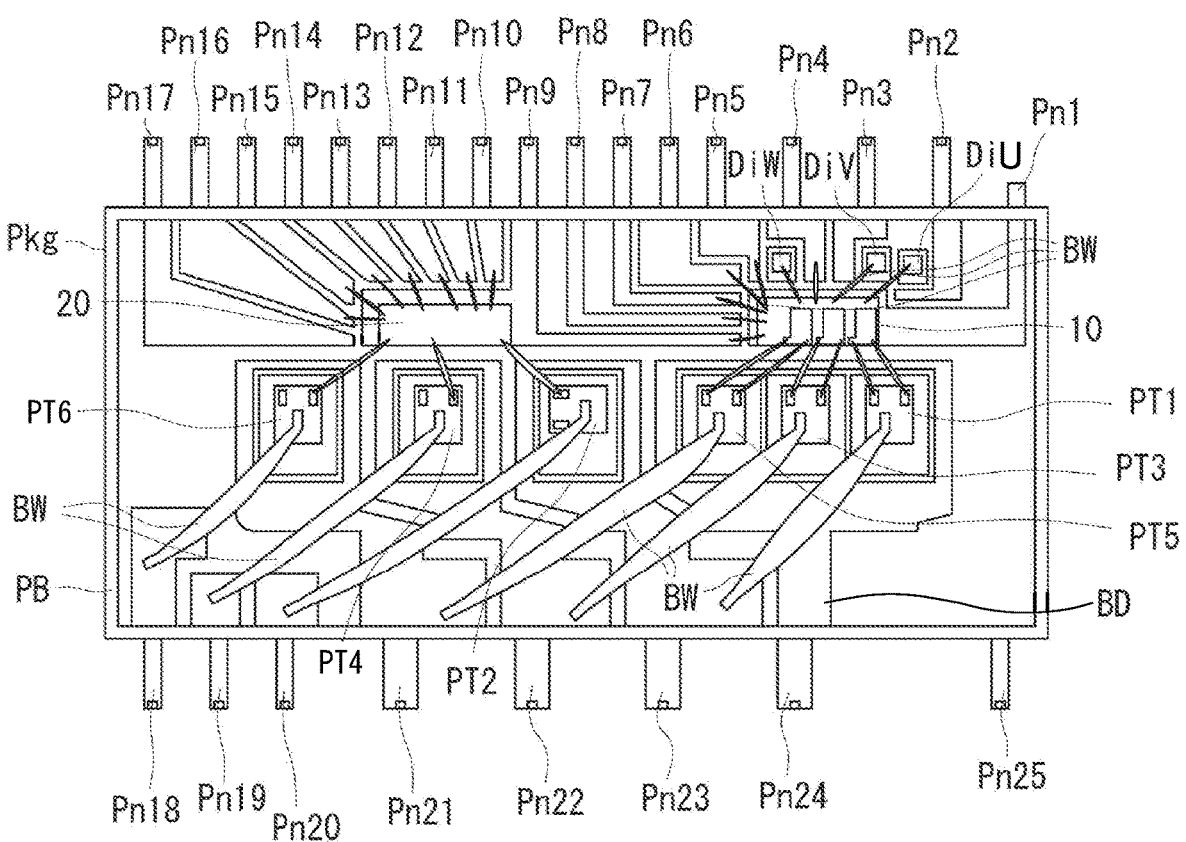
FIG. 7 is a plan view of a frame having the elements of a switch driving device die-bonded on it.

As mentioned earlier, the switch driving device 100 is formed so as to be housed in a single package Pkg. The package Pkg of the switch driving device 100 will now be described with reference to the relevant drawing. FIG. 6 is a perspective view of the package Pkg as seen from the underside. In the package Pkg, as shown in FIG. 7, which will be referred to later, the high-side driver circuit 10, the low-side driver circuit 20, the power switch circuit PSW, and the boot diodes DiU, DiV, and DiW are mounted on a frame BD and are then sealed in a resin sealing member PB. The resin sealing member PB covers the frame BD with electrically insulating resin. From the side face of the resin sealing member PB, 25 terminals Pn1 to Pn25 protrude. These terminals will be described below with reference also to FIG. 2 referred to earlier.

The terminals Pn1, Pn17, and Pn25 are non-connected terminals. The terminals Pn2 to Pn4 are floating power terminals of U, V, and W phases (that is, terminals fed with the voltage VB, which is generated for each phase in the bootstrap circuit BTC). The terminals Pn5 to Pn7 are terminals to which signals from the motor control unit MCU are fed and via which the energization control signals (huin, hvin, and hwin) for the high-side transistors PT1, PT3, and PT5 of U, V, and W phases, respectively, are fed to the high-side driver circuit 10. The terminal Pn8 is a terminal via which the control voltage VCC from the first power source PW1 is fed to the high-side driver circuit 10. The terminals Pn9 and Pn16 are ground terminals. The terminals Pn10 to Pn12 are terminals fed with signals from the motor control unit MCU and via which the energization control signals (luin, lvin, and lwin) for the low-side transistors PT2, PT4, and PT6 of U, V, and W phases, respectively, are fed to the low-side driver circuit 20.

The terminal Pn13 is a terminal via which the control voltage VCC from the first power source PW1 is fed to the low-side driver circuit 20. The terminal Pn14 is a terminal via which an error signal of the switch driving device 100 is transmitted from the low-side driver circuit 20 out to the motor control unit MCU. The terminal Pn15 is a short-circuit trip voltage sense terminal. The terminals Pn18 to Pn20 are the source electrodes of the low-side transistors PT2, PT4, and PT6 of U, V, and W phases, respectively. The terminals Pn21 to Pn23 are output terminals that are connected to the U-, V-, and W-phase coils MU, MV, and MW respectively. The terminal Pn24 is connected to the second power source PW2 and feeds the drive voltage VDC to the power switch circuit PSW in the switch driving device 100.

As described above, to the switch driving device 100 are connected the first power source PW1, which supplies the control voltage VCC, and the second power source PW2, which supplies the drive voltage VDC. It is assumed that the control voltage VCC is a low voltage and that the drive voltage VDC is a high voltage. In the package Pkg, the terminals Pn5 to Pn16 and Pn18 to Pn20 are low-voltage-side terminals to which the control voltage VCC or a voltage lower than it is applied, and the terminals Pn2 to Pn4 and Pn21 and Pn24 are high-voltage-side terminals to which the drive voltage VDC is applied. In the package Pkg, the gaps between the low-voltage-side terminals are smaller than the gaps between the high-voltage-side terminals. This is because the higher the voltage applied to terminals, the greater the need to avoid short-circuiting between adjacent one of them, and the greater the electrical influence (such as noise) that they exert on the surrounding terminals and circuits.

Next, the arrangement of elements inside the package Pkg of the switch driving device 100 will be described with reference to the relevant drawings. FIG. 7 is a plan view of the frame BD on which the elements of the switch driving device 100 have been die-bonded. As shown in FIG. 7, in a middle part of the frame BD, the high-side transistors PT1, PT3, and PT5 and the low-side transistors PT2, PT4, and PT6 are arranged in a row. The high-side transistors PT1, PT3, and PT5 and the low-side transistors PT2, PT4, and PT6 are elements to which a high voltage is applied (that is, high-withstand-voltage elements), and are arranged with such gaps between them as not to exert electrical influence on each other. The high-side driver circuit 10, which drives the high-side transistors PT1, PT3, and PT5, and the low-side driver circuit 20, which drives the low-side transistors PT2, PT4, and PT6, are each configured as a single-chip IC. The high-side driver circuit 10 and the high-side transistors PT1, PT3, and PT5 are arranged with such gaps between them as not to exert electrical influence on each other. The low-side driver circuit 20 and the high-side transistors PT2, PT4, and PT6 are arranged with such gaps between them as not to exert electrical influence on each other.

The high-side driver circuit 10 is arranged at the middle or substantially at the middle along the direction of arrangement of the high-side transistors PT1, PT3, and PT5. The high-side driver circuit 10 and the high-side transistors PT1, PT3, and PT5 are connected together by wires BW of a low-resistivity metal such as gold. The position at which the high-side driver circuit 10 is fitted on the frame BD is determined so that the wires BW have lengths within a given range. The transistors PT1 to PT6 and the terminals Pn18 to Pn23 are connected together so as to correspond to each other as shown in FIG. 7, and they too are connected together by wires BW. The positions at which the transistors and the terminals are arranged are determined so that the wires BW have lengths within a given range. As the wires BW connecting between the transistors PT1 to PT6 and the terminals Pn18 to Pn23, aluminum wires are used.

The high-side driver circuit 10 and the boot diodes DiU, DiV, and DiW are likewise connected together by wires BW. The arrangement of the high-side driver circuit 10 and the boot diodes DiU, DiV, and DiW is determined so that the wires BW have lengths within a given range. The high-side driver circuit 10 and the frame BD are connected together by wires BW, and are so formed that the wires BW have lengths within a given range. The low-side driver circuit 20 and the frame BD are connected together by wires BW, and are so formed that the wires BW have lengths within a given range.

By mounting the individual elements at appropriate positions on the frame BD in this way, it is possible to give the wires BW lengths within a given range, thereby to suppress variations in the resistance and parasitic capacitance of the wires BW, and thereby to suppress signal delays and the like resulting from variations in the resistance and parasitic capacitance of the wires BW. It is thus possible to operate the motor M precisely. Moreover, shortening the wires BW helps reduce defects, such as displaced wires, during the manufacturing process.

Figure 8:
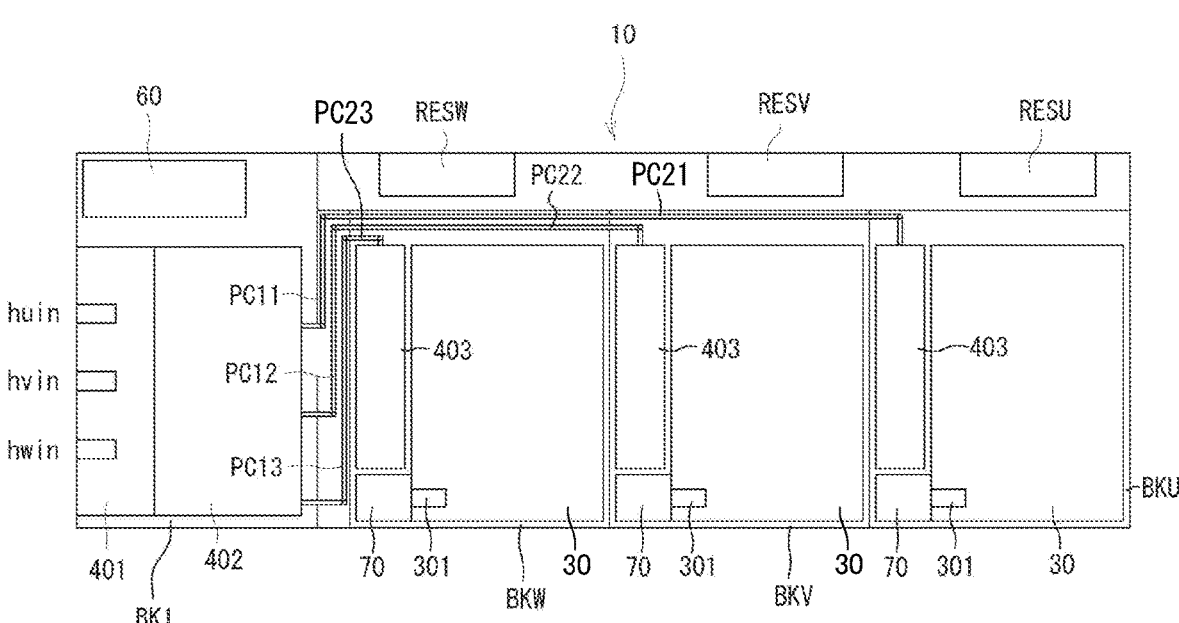
FIG. 8 is a schematic diagram showing an outline of a configuration of an integrated circuit constituting a high-side driver circuit.

As described above, the high-side driver circuit 10 is fed with both a high-voltage drive voltage VDC and a low-voltage control voltage VCC. The high-side driver circuit 10 includes elements (circuits) that are driven with the control voltage VCC and elements (circuits) that are driven with the drive voltage VDC. Now, the configuration of the high-side driver circuit 10 will be described in detail with reference to the relevant drawing. FIG. 8 is a schematic diagram showing an outline of the configuration of the integrated circuit device that constitutes the high-side driver circuit 10. As shown in FIG. 8, the high-side driver circuit 10 has an input block BK1 in which are arranged the input signal control circuit 40 (in particular the inverter 401 and the level shift circuit 402), which is fed with the energization control signals huin, hvin, and hwin, and the current controller 60. The high-side driver circuit 10 also has a U-phase block BKU, a V-phase block BKV, and a W-phase block BKW that include high-side gate drivers 30 for driving the gates of the high-side transistors PT1, PT3, and PT5 of U, V, and W phases respectively. The high-side driver circuit 10 further has current limiter regions RESU, RESV, and RESW in which are formed current limiters 50 of U, V, and W phases respectively.

As shown in FIG. 8, the input block BK1 is arranged in a left-hand end part of a semiconductor substrate (chip). To the right of the input block BK1, next to it, is arranged the W-phase block BKW; to its immediate right is arranged the V-phase block BKV; and in a rightmost end part is arranged the U-phase block BKU. The current limiter regions RESU, RESV, and RESW are all arranged at the upper end of the semiconductor substrate (chip), and are arranged above the W-phase, V-phase, and U-phase blocks BKW, BKV, and BKU respectively. To the current limiter regions RESU, RESV, and RESW respectively, the anodes of the above-mentioned boot diodes DiU, DiV, and DiW are connected. The terminals Pn2 to Pn4 are connected to power pads of the U-phase, V-phase, and W-phase blocks BKU, BKV, and BKW.

The input block BK1 is what can be called a low-voltage block in which are arranged elements that are controlled with the control voltage VCC (or an internal supply voltage VREG generated based on it). In the input block BK1, to prevent malfunctioning of the current controller 60, this is arranged in a region away from the W-phase block BKW, that is, here, to the upper left of the W-phase block BKW.

In each of the W-phase, V-phase, and U-phase blocks BKW, BKV, and BKU, the pulse generator 403 in the input signal control circuit 40 is arranged, and so are the high-withstand-voltage level shift circuit 70 and the high-side gate driver 30. In the high-side gate driver 30, the clamp circuits 301 is provided. The high-withstand-voltage level shift circuit 70 and the high-side gate driver 30 are regions to which the drive voltage VDC is applied, and are thus high-voltage regions. As shown in FIG. 8, the high-with-stand-voltage level shift circuit 70 and the clamp circuits 301 are arranged next to each other in the left-right direction, and are arranged with their respective middle lines aligned in the up-down direction. Thus, the arrangement of the conductor pattern of the signal lines for transmission of the set pulse signal and the elements connected to it and the arrangement of the conductor pattern of the signal lines for transmission of the reset pulse signal and the elements connected to it are symmetrical with each other about the just-mentioned middle lines. This helps suppress variations in the signals from the high-withstand-voltage level shift circuit 70 to the clamp circuits 301 (more specifically, the set and reset pulse signals which are fed to an RS flip-flop (unillustrated) via an inverter (unillustrated) provided in the first stage of the high-side gate driver 30).

The U-phase, V-phase, and W-phase blocks BKU, BKV, and BKW each include the pulse generator 403. The pulse generators 403 in the U-phase, V-phase, and W-phase blocks BKU, BKV, and BKW are fed with signals for controlling the energization of the high-side transistors PT1, PT3, and PT5 of different phases, respectively, from the level shift circuit 402 arranged in the input block BK1 (although, in FIG. 8, the level shift circuit 402 is shown as a single block, in practice the input block BK1 includes level shift circuits one for each of different phases).

The semiconductor substrate (chip) of the high-side driver circuit 10 is a multi-layer substrate that has a plurality of (for example, two) wiring layers. A first wiring layer, which is formed on an element formation region of the semiconduc-tor substrate (chip), has pattern conductors PC11, PC12, and PC13 that extend upward from a right-hand end part of the level shift circuit 402. The pattern conductors PC11, PC12, and PC13 are arranged between the input block BK1 and the W-phase block BKW, and are arranged parallel to each other in the left-right direction. Upper end parts of the pattern conductors PC11, PC12, and PC13 reach an upper end part of the W-phase block BKW. On a second wiring layer, which is arranged over the first wiring layer, pattern conductors PC21, PC22, and PC23 that extend in the left-right direction is arranged, with the pattern conductor PC11 connected to the pattern conductor PC21, the pattern conductor PC12 connected to the pattern conductor PC22, and the pattern conductor PC13 connected to the pattern conductor PC23, each pair across an interlayer via (unillustrated). The pattern conductors PC21, PC22, and PC23 are arranged parallel to each other in the up-down direction. The pattern conductor PC21 is connected to the pulse generator 403 in the U-phase block BKU. The pattern conductor PC22 is connected to the pulse generator 403 in the V-phase block BKV. The pattern conductor PC23 is connected to the pulse generator 403 in the W-phase block BKW. What is shown in FIG. 8 is merely an example, and the layout in which the pattern conductors are arranged may be modified as desired.

Providing the pattern conductors PC11, PC12, and PC13 in the first wiring layer and providing the pattern conductors PC21, PC22, and PC23 in the second wiring layer as described above helps prevent the pattern conductors that are connected from the level shift circuit 402 to each of the U-phase, V-phase, and W-phase blocks BKU, BKV, and BKW from intersecting other signals. Moreover, these pat-tern conductors are laid to make a detour around the current controller 60. This makes the signals that are sent from the level shift circuit 402 to the pulse generator 403 less likely to be affected by other signals.

As described above, in the switch driving device 100, the bootstrap circuit BTC is operated reliably to secure voltages necessary for the high-side transistors PT1, PT3, and PT5 to operate. In addition, the boot capacitor BC1 is prevented from being overcharged, and thereby the drive signals for driving the high-side transistors PT1, PT3, and PT5 are prevented from becoming equal to or higher than the per-missible gate voltage. It is thus possible to reliably make the high-side transistors PT1, PT3, and PT5 operate and to prevent degradation, destruction, and the like of the high-side transistors PT1, PT3, and PT5 resulting from their being fed with a drive signal equal to or higher than the permis-sible gate voltage.

Second Embodiment

Figure 9:
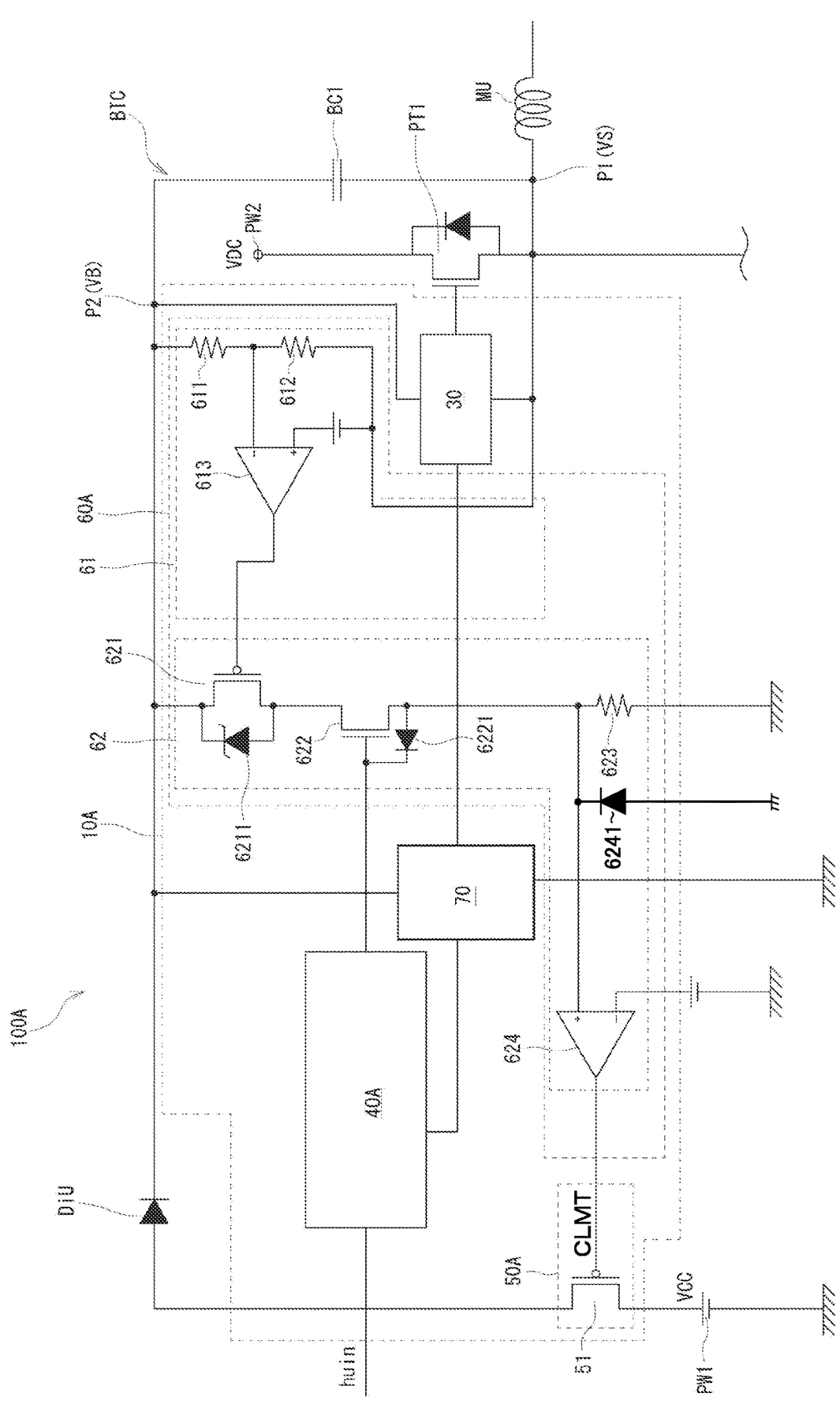
FIG. 9 is a circuit diagram of another example of a high-side driver circuit provided in a switch driving device according to the present invention.

FIG. 9 is a circuit diagram of another example of the high-side driver circuit provided in a switch driving device according to the present invention. The switch driving device 100A of this embodiment includes, in a high-side driver circuit 10A, an input signal control circuit 40A, a current limiter 50A, and a current controller 60A which differ from those in the switch driving device 100. The high-withstand-voltage level shift circuit 70 here has the same configuration as in the first embodiment, and is there-fore not illustrated in detail here.

As shown in FIG. 9, the current limiter 50A includes a current limiting transistor 51. The current limiting transistor 51 is a P-type MOSFET. The source of the current limiting transistor 51 is connected to the first power source PW1. The drain of the current limiting transistor 51 is connected to the anode of the boot diode DiU. The gate of the current limiting transistor 51 is fed with a current limiting signal CLMT from the current controller 60A.

When the current limiting signal CLMT is a L signal, the current limiting transistor 51 is on, and a current is fed to the boot capacitor BC1. When the current limiting signal CLMT is a H signal, the current limiting transistor 51 is off, and the supply of the current to the boot capacitor BC1 is limited.

The current controller 60A includes a voltage sense circuit 61 and a level shift circuit 62. The voltage sense circuit 61 senses the voltage (VB-VS) at the second point P2 relative to the first point P1. In other words, the voltage (VB-VS) is the charge voltage VBS across the boot capacitor BC1.

As shown in FIG. 9, the voltage sense circuit 61 comprises two resistors 611 and 612, which are voltage division resistors connected in series between the second point P2 and the first point P1. The connection point between the resistors 611 and 612 is connected to the inverting input terminal of a comparator 613, of which the non-inverting input terminal is fed with a voltage higher than the voltage VS at the first point P1 by a prescribed voltage. This prescribed voltage is the threshold voltage. That is, until the voltage (VB-VS) exceeds the threshold voltage, the comparator 613 outputs a H signal. When the voltage (VB-VS) exceeds the threshold voltage, the comparator 613 outputs a L signal. The output of the comparator 613 is fed to the level shift circuit 62.

The level shift circuit 62 receives a signal from the voltage sense circuit 61 and a signal from the input signal control circuit 40A, and feeds the current limiting signal to the current limiter 50A.

The level shift circuit 62 includes a first transistor 621, a second transistor 622, a current sense resistor 623, and a comparator 624. The first transistor 621 is a P-type MOSFET, and the second transistor 622 is an N-type MOSFET. The source of the first transistor 621 is connected to the second point P2, or to the same potential as the second point P2. The drain of the first transistor 621 is connected to the drain of the second transistor 622. The gate of the first transistor 621 is fed with the output signal of the comparator 613 in the voltage sense circuit 61. The source of the second transistor 622 is grounded via a resistor 623. The gate of the second transistor 622 is fed with a signal from the input signal control circuit 40A. Between the gate and the source of the second transistor 622, a surge-absorbing diode 6221 is connected.

The voltage at the connection point between the source of the second transistor 622 and the resistor 623 is fed to the non-inverting input terminal of the comparator 624. Between the non-inverting input terminal of the comparator 624 and a grounded terminal, a surge-absorbing diode 6241 is connected with its polarity as illustrated. The inverting input terminal of the comparator 624 is fed with a predetermined threshold voltage. The output of the comparator 624 is fed, as the current limiting signal CLMT, to the gate of the current limiting transistor 51 in the current limiter 50A.

As mentioned earlier, the voltage VB at the second point P2 can be as high as over 300 V. To cope with that, the first transistor 621 has a voltage-clamping Zener diode 6211 connected in parallel with it. Thus, the voltage between the source and the drain of the first transistor 621 is clamped to be equal to or lower than a prescribed voltage. Although, in FIG. 9, the clamper is shown to be a single Zener diode 6211, it may instead be composed of a plurality of Zener diodes 6211 connected in series. As the second transistor 622, a high-withstand-voltage transistor is used.

The first transistor 621 is off when its gate is fed with a H signal, and is on when its gate is fed with a L signal. That is, when the charge voltage across the boot capacitor BC1 reaches the threshold voltage, a L signal from the comparator 613 is fed to the gate of the first transistor 621. This turns the first transistor 621 on, so that a current can now pass in the first transistor 621. However, no current passes so long as the second transistor 622 is off.

The second transistor 622 is on when its gate is fed with a H signal, and is off when its gate is fed with a L signal. When the energization control signal huin from the motor control unit MCU is a H signal, the input signal control circuit 40A feeds a L signal to the second transistor 622. When the energization control signal huin from the motor control unit MCU is a L signal, the input signal control circuit 40A feeds a H signal to the second transistor 622. Moreover, when the energization control signal huin is a L signal, the high-side transistor PT1 is off. Thus, the second transistor 622 is on when the high-side transistor PT1 is off.

That is, in the level shift circuit 62, when the high-side transistor PT1 is off and in addition the charge voltage across the boot capacitor BC1 is higher than the threshold voltage, a current passes in the current sense resistor 623. A current passing in the current sense resistor 623 results in a voltage being applied to the non-inverting input terminal of the comparator 624. Thus, the comparator 624 outputs a H signal as the current limiting signal CLMT. This turns the current limiting transistor 51 off, and the current that charges the boot capacitor BC1 is limited.

That is, the switch driving device 100A operates as follows. In the voltage sense circuit 61, the charge voltage across the boot capacitor BC1 is sensed. In the input signal control circuit 40A, based on the energization control signal huin, whether the high-side transistor PT1 is on or off is sensed. When the high-side transistor PT1 is off and in addition the charge voltage across the boot capacitor BC1 is higher than the threshold voltage, the current that charges the boot capacitor BC1 is limited, so that the charging of the boot capacitor BC1 is limited. It should be noted that the boot capacitor BC1 is charged when the high-side transistor PT1 is off. Thus, the current controller 60A limits the current that charges the boot capacitor BC1 when, in a state where the boot capacitor BC1 is charged (is being charged), the charge voltage across the boot capacitor BC1 exceeds a prescribed value.

With the configuration described above, it is possible to provide a switch driving device 100A that, while suppressing an overcharged state of the boot capacitor BC1, can make the bootstrap circuit BTC operate accurately. It is thus possible to apply an adequate voltage to the load (motor) with accurate timing, and to permit the load (motor) to operate precisely.

Figure 10:
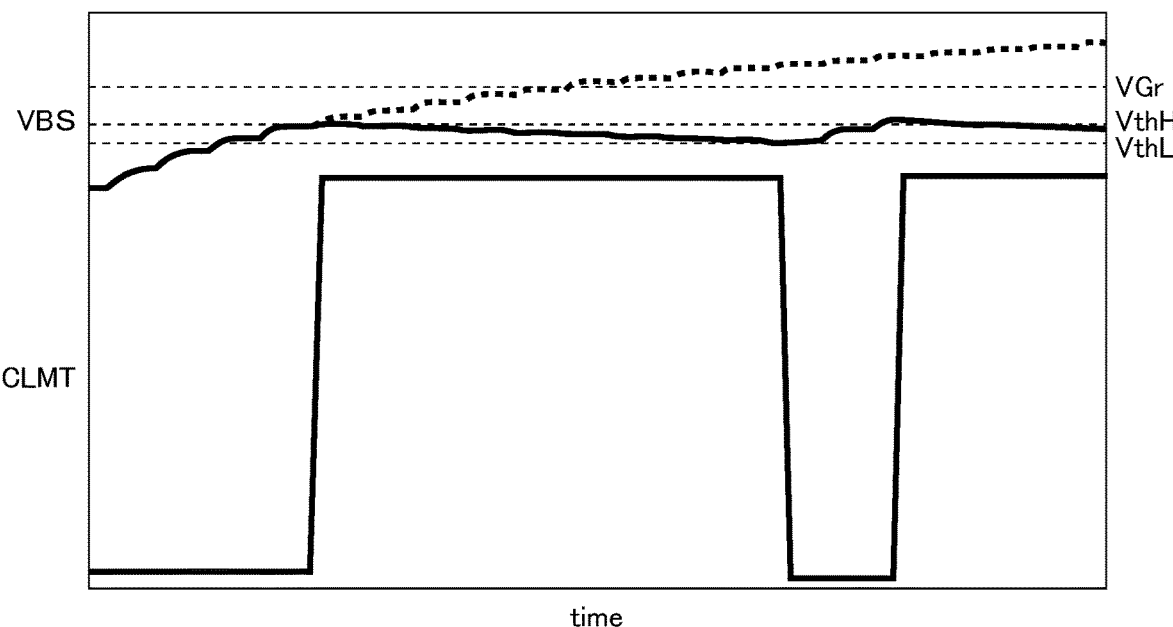
FIG. 10 is a diagram showing how an overcharged state of a boot capacitor BC1 is suppressed.

FIG. 10 is a diagram showing how an overcharged state of the boot capacitor BC1 is suppressed. In the diagram, which depicts the charge voltage VBS across the boot capacitor BC1, a solid line indicates behavior in this embodiment while a broken line indicates conventional behavior.

As shown in FIG. 10, in the switch driving device 100A of this embodiment, when the current limiting signal CLMT turns to high level, the current limiting transistor 51 turns off, and the charge current to the boot capacitor BC1 is cut off. Thus, the floating supply voltage (that is, the voltage VB at the second point P2) does not rise excessively.

It is preferable to use, as the comparator 613 in the voltage sense circuit 61, a hysteresis comparator that has, as threshold voltages with which to compare the charge voltage VBS across the boot capacitor BC1, two values, namely an overcharge sense threshold value VthH and an overcharge sense cancel threshold value VthL (where VthH>VthL).

For example, the overcharge sense threshold value VthH can be set at a voltage value (for example, 19.5 V (with variation taken into consideration, between a minimum of 18 V and a maximum of 21 V)) slightly lower than the absolute maximum rated gate voltage VGr (in SiC-based MOSFETs, for example, 22 V) of each of the high-side transistors PT1, PT3, and PT5. The overcharge sense cancel threshold value VthL can be set at a voltage value (for example, 19 V (with variation taken into consideration, between a minimum of 17.5 V and a maximum of 20.5 V)) still lower than the overcharge sense threshold value VthH. These settings permit the high-side transistors to be driven at or below their absolute maximum rated gate voltage.

Modified Example

Figure 11:
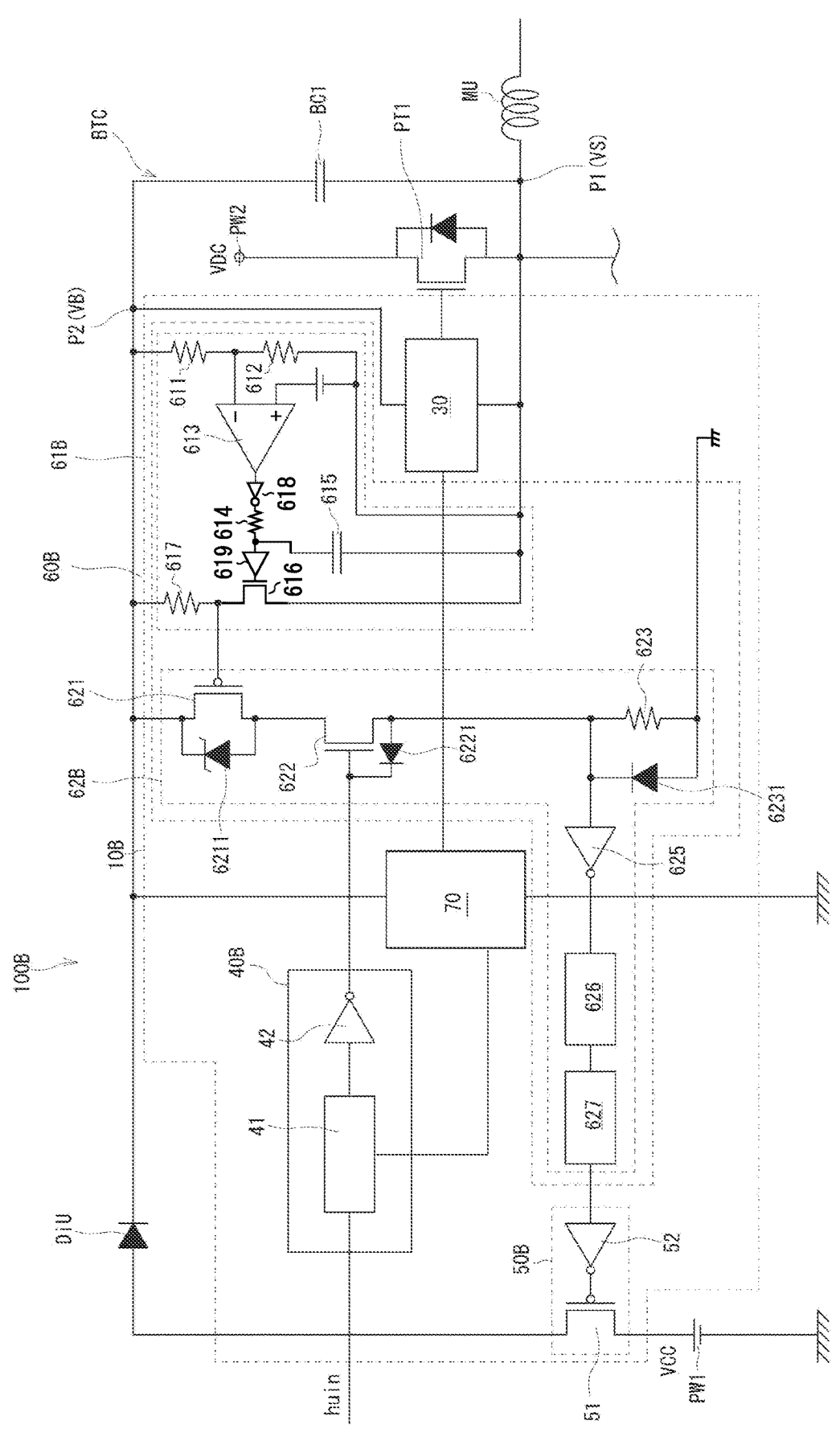
FIG. 11 a circuit diagram of a modified example of a high-side driver circuit according to the present invention.

A modified example of the embodiment under discussion will now be described with reference to the relevant drawings. FIG. 11 is a circuit diagram showing a modified example of a high-side driver circuit according to the present invention. The high-side driver circuit 10B shown in FIG. 11 is an improved version of the high-side driver circuit 10A shown in FIG. 9. Thus, like the high-side driver circuit 10A, the high-side driver circuit 10B senses, based on the energization control signal huin, the high-side transistor PT1 being off, and limits the current that charges the boot capacitor BC1 when the charge voltage across the boot capacitor BC1 reaches a threshold voltage.

The differences of the high-side driver circuit 10B from the high-side driver circuit 10A are as follows. As shown in FIG. 11, a current limiter 50B includes an inverter 52 that inverts an input signal fed to the current limiter 50B (that is, the output signal of a retarder 627) and then outputs the result. The output of the inverter 52 is fed to the gate of the current limiting transistor 51.

A voltage sense circuit 61B in a current controller 60B includes resistors 611 and 612 just like those in the voltage sense circuit 61.

The output of the comparator 613 is fed via an inverter 618 to a delay circuit (which is an RC time constant circuit) comprising a combination of a resistor 614 with a capacitor 615). The delay circuit delays the output signal of the inverter 618, and thereby adjusts the timing of current limiting. The output of the delay circuit is fed via a buffer 619 to the gate of a transistor 616. The buffer 619 can comprise two stages of inverters connected in tandem. The inverter 618 may be replaced with a buffer, and the buffer 619 may be replaced with an inverter. So long as the gate of the transistor 616, newly introduced here, can be fed with a gate signal with an appropriate logic level, any number of stages of inverters can be provided in the stage succeeding the comparator 613. The transistor 616 is an N-type MOS-FET. The drain of the transistor 616 is connected via a resistor 617 to the second point P2, or to a point at the same potential as the second point P2. The source of the transistor 616 is connected to the first point P1, or to a point at the same potential as the first point P1. Thus, when a L signal is output from the comparator 613, the transistor 616 is on, so that a current passes in the resistor 617. This causes a voltage to appear between the gate and the source of the first transistor 621 in a level shift circuit 62B, so that the first transistor 621 turns on. Thus, the voltage sense circuit 61B turns the first transistor 621 on after the charge voltage across the boot capacitor BC1 has reached the threshold voltage.

An input signal control circuit 40B includes a level shifter 41 and an inverter 42. The energization control signal huin, which is fed to the input signal control circuit 40B, is, for example, a 0 V/5 V signal. A switch driving device 100B uses, as the control voltage VCC, for example, 18 V. Accordingly, the level shifter 41 raises the energization control signal huin to adapt it to the control voltage VCC for the switch driving device 100B. The inverter 42 inverts the so raised signal. The inverted signal, that is, the inverted signal of the energization control signal huin, is fed to the gate of the second transistor 622. Though illustrated in a simplified manner in FIG. 11, the input signal control circuit 40B has a similar configuration to the input signal control circuit 40 (see FIG. 5 referred to earlier), and has a signal path going through a Schmitt buffer, then a level shifter, and then a pulse generator, thereby delivering the output of the level shifter to the inverter 42.

One end of the current sense resistor 623 in the level shift circuit 62B is connected to the grounded terminal. To the connection point between the source of the second transistor 622 and the resistor 623 is connected, instead of the comparator 624, an inverter 625 that inverts the input signal to it and then outputs the result. Moreover, in parallel with the resistor 623, a diode 6231 is connected with its forward direction pointing from the grounded terminal to the inverter 625. The output of the inverter 625 is fed to a level shifter 626, and the output of the level shifter 626 is fed to the retarder 627. The output of the retarder 627 is fed to the current limiter 50B.

For example, when, as the energization control signal huin, a L-level signal is fed to the input signal control circuit 40B, the high-side transistor PT1 is off. Here, in the input signal control circuit 40B, despite the level shifter 41 being ready to perform level shifting, since the input signal is at L level, its L level is maintained. The inverter 42 inverts the signal level, so that a H-level signal is fed to the gate of the second transistor 622. This turns the second transistor 622 on. When the first transistor 621 is on, a current passes in the resistor 623, and a H-level signal is fed to the inverter 625, which then outputs a L-level signal. Despite the level shifter 626 being ready to perform level shifting, since the input signal is at L level, its L level is maintained. The signal is then delayed by the retarder 627. The retarder 627 is provided for elimination of noise. As mentioned above, the input signal control circuit 40B has a similar configuration to the input signal control circuit 40 (see FIG. 5 referred to earlier), and has a signal path going through a Schmitt buffer, then a level shifter, and then a pulse generator, thereby delivering the output of the level shifter to the inverter 42.

The L-level output signal of the retarder 627 is fed to the inverter 52 in the current limiter 50B. The L-level input signal is inverted by the inverter 52, so that a H-level output signal is fed to the gate of the current limiting transistor 51. This turns the current limiting transistor 51 off, and thus the supply of the charge current to the boot capacitor BC1 is stopped.

In the switch driving device 100B, using a plurality of inverters helps eliminate the influence of a delay due to parasitic capacitances in conductors, resistors, transistors, and the like. It is thus possible to control the load (motor) more finely.

Figure 12:
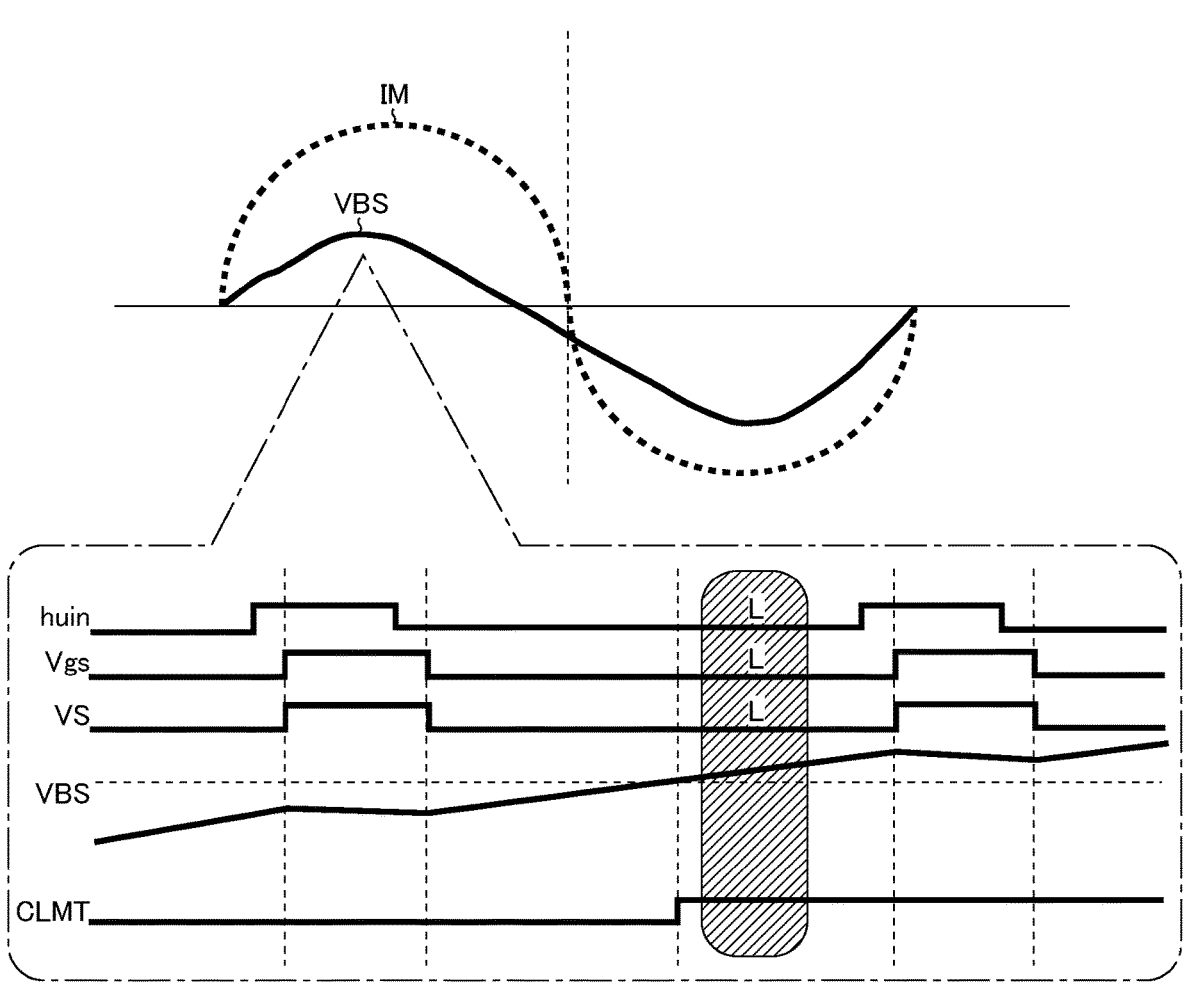
FIG. 12 is a timing chart illustrating timing of occurrence of overvoltage.

Next, a supplementary description will be given of the timing of occurrence of overcharging with reference to FIG. 12. FIG. 12 is a timing chart illustrating the timing of occurrence of overcharging, depicting the charge voltage VBS (solid line) across the boot capacitor BC1 and the motor current IM (broken line), accompanied by a partial chart on a shorter time scale, depicting the energization control signal huin, the gate-source voltage Vgs of the high-side transistor PT1, the voltage VS at the first point, and the charge voltage VBS.

As shown in FIG. 12, at the start of overcharging, huin=L and VS=L. With this behavior taken into account, in the second embodiment (and its modified example) described previously, the charge current to the boot capacitor BC1 is limited on sensing that the charge voltage across the boot capacitor BC1 is higher than the threshold voltage and in addition that huin=L.

However, as will be clear from FIG. 12, as a trigger for sensing the timing of occurrence of overcharging, instead of huin=L, VS=L may be sensed. As a modified example with such a design, a third embodiment will be presented below.

Third Embodiment

Figure 13:
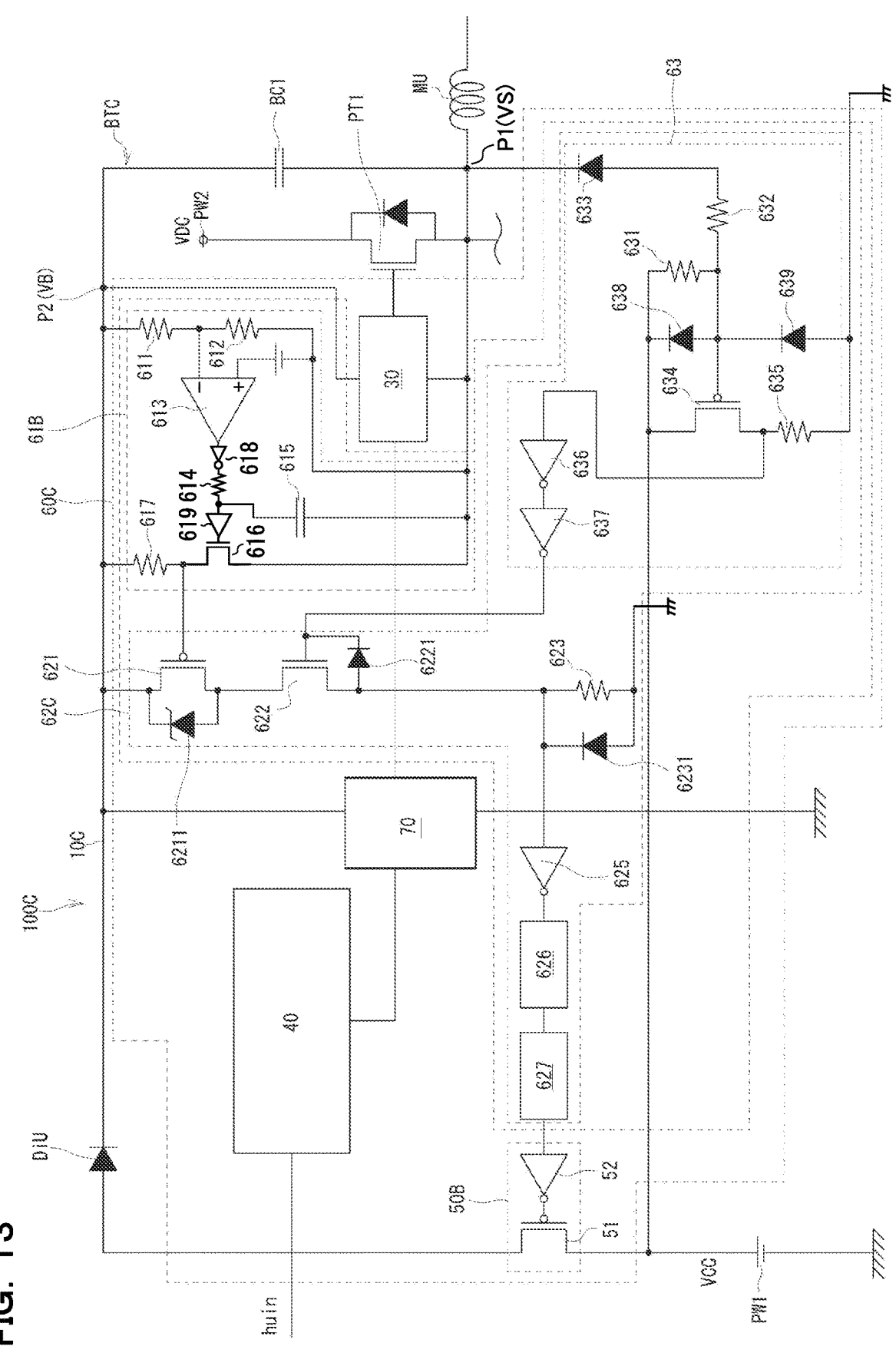
FIG. 13 is a circuit diagram showing another example of a high-side driver circuit used in a switch driving device according to the present invention.

Another example of a switch driving device according to the present invention will now be described with reference to the relevant drawing. FIG. 13 is a circuit diagram showing another example of the high-side driver circuit used in a switch driving device according to the present invention. The high-side driver circuit 10C shown in FIG. 13 includes a current controller 60C that senses the voltage VS at the first point P1, and in this respect differs from the high-side driver circuit 10B shown in FIG. 11. Another difference is that the input signal control circuit 40 does not output a signal that is fed to the gate of the second transistor 622 in the level shift circuit 62C. That is, the input signal control circuit 40 only includes a circuit that outputs a signal for the driving of the high-side gate driver 30. In other respects, the high-side driver circuit 10C has the same configuration as the high-side driver circuit 10B shown in FIG. 11. Accordingly, substantially the same parts will be identified by the same reference signs, and no description of the same parts will be repeated.

Now, a description will be given of overcharging of the boot capacitor BC1. As mentioned earlier, through regenerating operation in the U-phase coil MU, when the voltage VS at the first point P1 becomes equal to a predetermined potential lower than the ground potential, the boot capacitor BC1 is overcharged. To avoid that, in the switch driving device 100C, instead of the input signal (energization control signal huin) being sensed, the voltage VS at the first point P1 is sensed to sense the timing of occurrence of overcharging of the boot capacitor BC1, and the time that the voltage VS at the first point P1 becomes equal to a predetermined potential (low level) is taken as the timing of occurrence of overcharging. Then, when the voltage VS at the first point P1 becomes equal to a prescribed voltage (low level) and in addition the charge voltage VBS across the boot capacitor BC1 reaches the threshold voltage, the boot capacitor BC1 is judged to go into an overcharged state.

A reference voltage sense circuit 63 senses the voltage VS at the first point P1. As shown in FIG. 13, in the circuit connecting between the first power source PW1, or a point at the same potential as the first power source PW1, and the first point P1, or a point at the same potential as the first point, there are connected a first resistor 631, a second resistor 632, and a diode 633 in series in this order from the first power source PW1 side. The cathode of the diode 633 is connected to the first point P1, or to the point at the same potential as the first point. The reference voltage sense circuit 63 includes a transistor 634. The transistor 634 is a P-type MOSFET. The source of the transistor 634 is connected to the point at the same potential as the first power source PW1. The drain of the transistor 634 is connected to a grounded terminal via a resistor 635 which acts as a load.

The gate of the transistor 634 is connected to the connection point between the first and second resistors 631 and 632. The connection point between the drain of the transistor 634 and the resistor 635 is connected to the input of an inverter 636. The output of the inverter 636 is connected to the input of an inverter 637, and the output of the inverter 637 is connected to the gate of the second transistor 622 in the level shift circuit 62C. The inverters 636 and 637 each output an output signal with a voltage level inverted compared to the voltage level of the input signal to it.

For example, when the voltage VS at the first point P1 is equal to or higher than the control voltage VCC from the first power source PW1, no current passes in the diode 633. Accordingly, no current passes in either of the first and second resistors 631 and 632. Thus, the transistor 634 is off. As a result, a L-level signal is fed to the inverter 636, which thus outputs a H-level signal. A H-level signal is fed to the inverter 637, and a L-level signal is fed to the gate of the second transistor 622. Thus, the second transistor 622 is off.

On the other hand, when the voltage VS at the first point P1 is lower than the control voltage VCC from the first power source PW1, a current passes in the diode 633 to the first point P1. This current passes from the first power source PW1 to the first and second resistors 631 and 632. As a result of a current passing in the first resistor 631, the terminal-to-terminal voltage across it causes a voltage to be applied between the gate and the source of the transistor 634, which thus turns on. As a result, the current having passed in the transistor 634 passes in the resistor 635. Here, a H-level signal is fed to the inverter 637, which thus outputs a L-level signal. A L-level signal is fed to the inverter 637, and a H-level signal is fed to the gate of the second transistor 622. Thus, the second transistor 622 turns on. Now, a state is attained where an overcharged state can be sensed.

The gate-source voltage for turning on the transistor 634 is determined by the value of the resistance of the first resistor 631 and the value of the current passing in the first resistor 631. The current passing in the first resistor 631 is determined by the combined resistance of the first and second resistors 631 and 632 and the difference (VCC-VS) between the control voltage VCC from the first power source PW1 and the voltage VS at the first point P1. Also the diode 633 has an internal resistance, which, however, is much lower than those of the first and second resistors 631 and 632 and is therefore ignored. Thus, adjusting the resistance values of the first and second resistors 631 and 632 permits the transistor 634 to be turned on when the voltage VS at the first point P1 becomes a voltage at which overcharging can occur.

Between the gate and the drain, and also between the gate and the source, of the transistor 634, there are connected surge-absorbing diodes 638 and 639 respectively.

As described above, the current controller 60C in the switch driving device 100C senses, in the reference voltage sense circuit 63, the voltage VS at the first point P1. When the voltage VS becomes equal to a prescribed voltage (the voltage VS as it is when the boot capacitor BC1 goes into an overcharged state) lower than the ground voltage and in addition the charge voltage VBS across the boot capacitor BC1 reaches the threshold voltage, the current controller 60C judges that the boot capacitor BC1 goes into an overcharged state, and limits the charge current to the boot capacitor BC1. It is thus possible to reliably charge the boot capacitor BC1 up to the required voltage and to more reliably prevent it from going into an overcharged state.

In the second and third embodiments, the current controller 60B (60C) checks whether the boot capacitor BC1 is in an overcharged state or not by checking the input signal huin or the voltage VS at the first point P1 and the charge voltage VBS across the boot capacitor BC1. As mentioned earlier, the boot capacitor BC1 can go into an overcharged state when the high-side and low-side transistors PT1 and PT2 are in mode 2. Accordingly, it is also possible to control the current limiter 50 by sensing the gate signal HU for the high-side transistor PT1 and the gate signal LU for the low-side transistor PT2 and thereby sensing their being in mode 2, that is, by sensing the high-side transistor PT1 being off and the low-side transistor PT2 being off.

Figure 14:
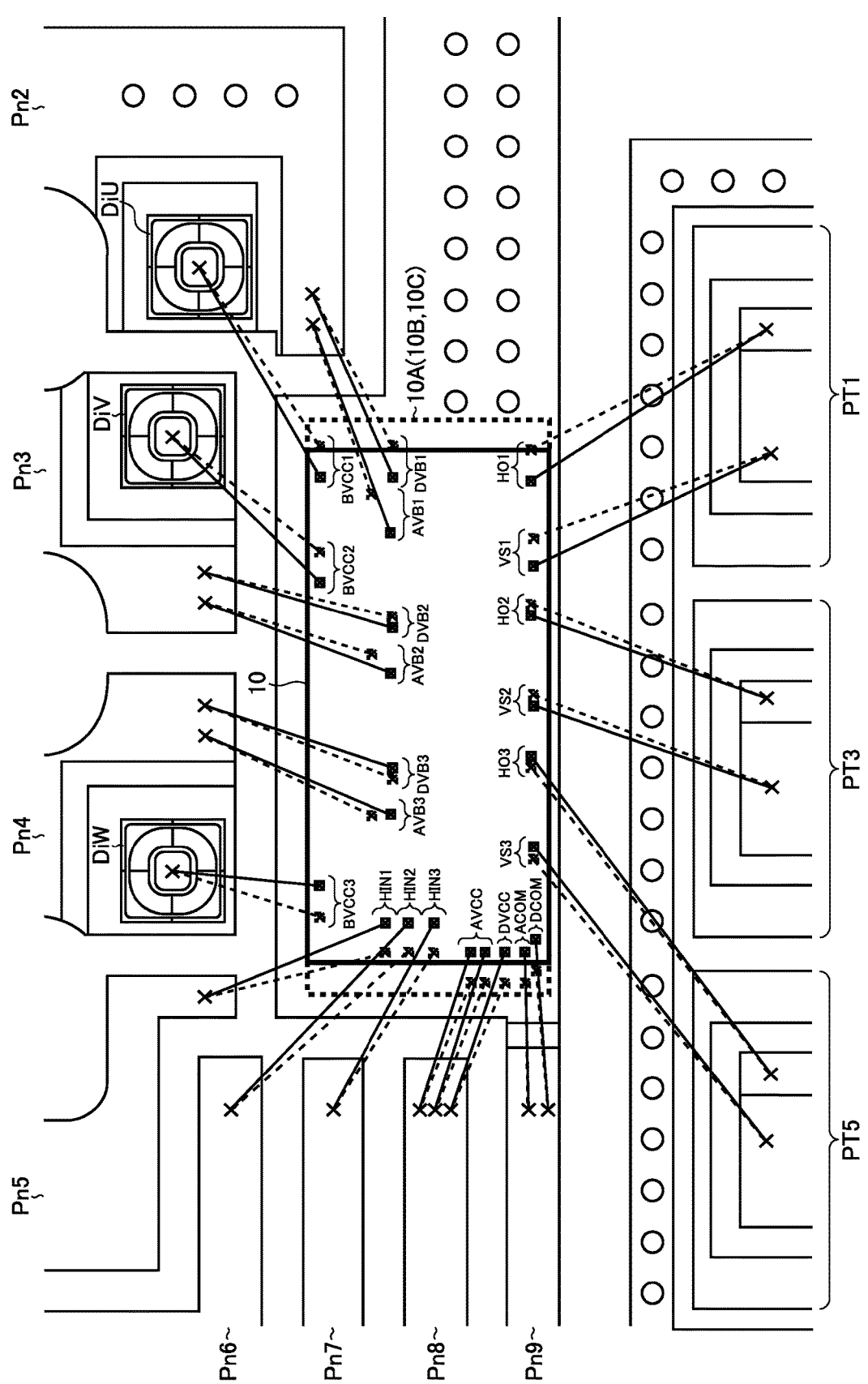
FIG. 14 is a plan view showing an example of arrangement of pads in a high-side driver circuit.

Lastly, pad arrangement in the high-side driver circuit 10 will be studied. FIG. 14 is a plan view showing an example of pad arrangement in the high-side driver circuit. As for the high-side driver circuit 10 in the first embodiment (FIG. 5), its chip, pads, and wires are all indicated by solid lines. On the other hand, as for the high-side driver circuit 10A to 10C in the second (FIG. 9 and FIG. 11) and third (FIG. 13) embodiments, its chip, pads, and wires are indicated by broken lines.

As shown in FIG. 14, on the surface of the high-side driver circuit 10, there are formed a plurality of pads (BVCC1 to BVCC3, AVB1 to AVB3, DVB1 to DVB3, HIN1 to HIN3, AVCC, DVCC, ACOM, DCOM, VS1 to VS3, and HO1 to HO3). These pads will now be described with reference, as necessary, also to FIGS. 2 and 7 referred to earlier.

The pads BVCC1 to BVCC3 are connected to the anodes of the boot diodes DiU, DiV, and DiW respectively.

The pads AVB1 and DVB1 are both connected to the cathode of the boot diode DiU (that is, to the terminal Pn2). The pads AVB2 and DVB2 are both connected to the cathode of the boot diode DiV (that is, to the terminal Pn3). The pads AVB3 and DVB3 are both connected to the cathode of the boot diode DiW (that is, to the terminal Pn4). The pads AVB1 to AVB3 are connected, within the chip, to analog-system boot power lines of different phases respectively. On the other hand, the pads DVB1 to DVB3 are connected, within the chip, to digital-system boot power lines of different phases respectively.

The pads HIN1 to HIN3 are connected to the terminals Pn5 to Pn7 respectively (that is, to input terminals of the energization control signals huin, hvin, and hwin).

A plurality of pads AVCC are provided, which are all connected to the terminal Pn8 (that is, to an input terminal of the control voltage VCC). The pad DVCC too is connected to the terminal Pn8. The pads AVCC are connected, within the chip, to an analog-system control voltage line. On the other hand, the pad DVCC is connected, within the chip, to a digital-system control voltage line.

The pads ACOM and DCOM are both connected to the terminal Pn9 (that is, a terminal to which the ground potential is applied). The pad ACOM is connected, within the chip, to an analog-system common power line. On the other hand, the pad DCOM is connected, within the chip, to a digital-system common power line.

The pads VS1 and HO1 are connected to the source and the gate, respectively, of the high-side transistor PT1. The pads VS2 and HO2 are connected to the source and the gate, respectively, of the high-side transistor PT3. The pads VS3 and HO3 are connected to the source and the gate, respectively, of the high-side transistor PT5.

As shown in FIG. 14, the high-side driver circuit 10 in the first embodiment and the high-side driver circuit 10A to 10C in the second and third embodiments have different circuit elements integrated together and have accordingly different chip sizes. More specifically, the high-side driver circuit 10A to 10C indicated by broken lines has a larger length than the high-side driver circuit 10 indicated by solid lines in the left-right direction of the diagram.

In conformity with the above-mentioned difference in chip size, it is preferable that the arrangement of the individual pads be adjusted such that the wires connected respectively to them have lengths within a given range. For example, optimizing pad arrangement as shown in FIG. 14 makes it possible to utilize time-tested existing packages, and thereby to give switch driving devices enhanced reliability.

Other Modifications

The various technical features disclosed herein may be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

INDUSTRIAL APPLICABILITY

Switch driving devices according to the present invention find applications, for example, as motor drivers for supplying driving electric power to a motor provided with coils.

LIST OF REFERENCE SIGNS

10, 10A, 10B, 10C high-side driver circuit
20 low-side driver circuit
30 high-side gate driver
40, 40A, 40B input signal control circuit
41 level shifter
42 inverter
50, 50A, 50B current limiter
51 current limiting transistor
52 inverter
60, 60A, 60B, 60C current controller
61, 61B voltage sense circuit
62, 62B, 62C level shift circuit
63 reference voltage sense circuit
70 high-withstand-voltage level shift circuit
71 transistor
72 transistor
73 resistor
74 resistor
100, 100A, 100B, 100C switch driving device
301 clamp circuit
401 inverter
402 level shift circuit
403 pulse generator
501 transistor
502 resistor
611 resistor
612 resistor
613 comparator
614 resistor
615 capacitor
616 transistor
617 resistor
618 inverter
619 buffer
621 first transistor
6211 Zener diode
622 second transistor
6221 diode 623 resistor
6231 diode
624 comparator
6241 diode
625 inverter
626 level shifter
627 retarder
631 first resistor
632 second resistor
633 diode
634 transistor
635 resistor
636 inverter
637 inverter
638 diode
639 diode
ACOM pad
AVB1, AVB2, AVB3 pad
AVCC pad
BC1, BC2, BC3 boot capacitor
BD frame
BK1 input block
BKU U-phase block
BKV V-phase block
BKW W-phase block
BTC bootstrap circuit
BVCC1, BVCC2, BVCC3 pad
BW wire
CLMT current limiting signal
DCOM pad
DRV driver circuit
DiU, DiV, DiW boot diode
DVB1, DVB2, DVB3 pad
DVCC pad
HIN1, HIN2, HIN3 pad
HO1, HO2, HO3 pad
HU, HV, HW drive signal
huin, hvin, hwin energization control signal
IM motor current
LU, LV, LW drive signal
luin, lvin, lwin energization control signal
M motor
MCU motor control unit
MMC motor driving device
MU U-phase coil
MV V-phase coil
MW W-phase coil
P1 first point
P2 second point
PB resin sealing member
PC11 pattern conductor
PC12 pattern conductor
PC13 pattern conductor
PC21 pattern conductor
PC22 pattern conductor
PC23 pattern conductor
Pkg package
PS power supply
PSW power switch circuit
PT1, PT3, PT5 high-side transistor
PT2, PT4, PT6 low-side transistor
PW1 first power source
PW2 second power source
Pn1 to Pn25 terminal
RESU, RESV, RESW current limiter region
VB voltage at a second point
VBS charge voltage VCC control voltage
VDC drive voltage
VS voltage at a first point
VS1, VS2, VS3 pad

The invention claimed is:

1. A switch driving device, comprising:
a gate driver configured to drive an N-type semiconductor switch element;
a current limiter configured to limit a current fed to a boot capacitor included in a bootstrap circuit configured to apply a voltage to the gate driver; and
a current controller configured to control operation of the current limiter,
wherein
the N-type semiconductor switch element employs a semiconductor made from silicon carbide,
the current limiter includes a resistor, and
the gate driver is configured to receive input signals via a Schmitt buffer.

2. The switch driving device according to claim 1, wherein
the current limiter includes a switch element configured to turn on or off in accordance with a signal from the current controller.

3. The switch driving device according to claim 1, wherein
the current controller is configured to sense the charge voltage across the boot capacitor based on a terminal-to-terminal voltage across the boot capacitor or a division voltage thereof.

4. The switch driving device according to claim 1, wherein
the N-type semiconductor switch element is a high-side switch element arranged between a power source and a load to form a half-bridge output stage, and
the current controller is configured to judge the boot capacitor to be being charged when the high-side switch element is off.

5. The switch driving device according to claim 4, wherein
the current controller is configured to judge whether the high-side switch element is on or off by acquiring a drive signal fed in from outside to drive the high-side switch element.

6. The switch driving device according to claim 1, wherein
the N-type semiconductor switch element is a high-side switch element arranged between a power source and a load to form a half-bridge output stage, and
the current controller is configured to sense a voltage at a connection point between the high-side switch element and the load to judge the boot capacitor to be being charged when the voltage is equal to or less than a threshold value.

7. The switch driving device according to claim 1, wherein
the current limiter is an element of which a resistance value is variable, and is connected to an anode side of a boot diode included in the bootstrap circuit, and
the current limiter is configured to sense a voltage of a control power source to which the bootstrap circuit is connected, the current limiter being configured to increase the resistance value of the current limiter when the control voltage is high and to decrease the resistance value of the current limiter when the control voltage is low.

8. The switch driving device according to claim 1, wherein the load is a three-phase alternating-current motor.

* * * * *